(12) United States Patent
Fuselier et al.

(10) Patent No.: US 7,432,136 B2
(45) Date of Patent: *Oct. 7, 2008

(54) TRANSISTORS WITH CONTROLLABLE THRESHOLD VOLTAGES, AND VARIOUS METHODS OF MAKING AND OPERATING SAME

(75) Inventors: Mark B. Fuselier, Austin, TX (US); Derick J. Wristers, Bee Caves, TX (US); Andy C. Wei, Radebeul/Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 461 days.

This patent is subject to a terminal disclaimer.

(21) Appl. No.: 10/140,441

(22) Filed: May 6, 2002

(65) Prior Publication Data

US 2003/0207504 A1    Nov. 6, 2003

(51) Int. Cl.
*H01L 21/00* (2006.01)
*H01L 21/8238* (2006.01)
*H01L 21/336* (2006.01)

(52) U.S. Cl. .................. 438/149; 438/157; 438/224; 438/289; 257/E21.32; 257/E21.634

(58) Field of Classification Search .............. 438/153, 438/154, 163, 479, 157, 224, 289, 283; 257/E21.634
See application file for complete search history.

(56) References Cited

U.S. PATENT DOCUMENTS 4,996,575 A    2/1991    Ipri et al. .................. 357/23.7

(Continued)

FOREIGN PATENT DOCUMENTS

DE    44 41 724 A1    5/1996

(Continued)

OTHER PUBLICATIONS

Office Action dated Apr. 30, 2007 from U.S. Appl. No. 11/533,460.

(Continued)

*Primary Examiner*—Zandra Smith
*Assistant Examiner*—Ron E Pompey
(74) *Attorney, Agent, or Firm*—Williams, Morgan & Amerson

(57) ABSTRACT

In one illustrative embodiment, the method comprises providing an SOI substrate comprised of an active layer, a buried insulation layer and a bulk substrate, the active layer being doped with a first type of dopant material, the bulk substrate having an inner well formed therein adjacent a surface of the bulk substrate and under the active layer, the inner well being doped with the first type of dopant material, forming a transistor above the SOI substrate in an area above the inner well and applying a voltage to the inner well to vary a threshold voltage of the transistor. In some embodiments, the method further comprises forming an NMOS transistor, wherein the active layer and the inner well are doped with a P-type dopant material. In other embodiments, the method further comprises forming a PMOS transistor, wherein the active layer and the inner well are doped with an N-type dopant material. In another illustrative embodiment, the method comprises providing a consumer product comprised of at least one integrated circuit product, the integrated circuit product being comprised of at least one transistor formed in an active layer of an SOI substrate, the SOI substrate further comprising an inner well formed adjacent a surface of a bulk substrate of the SOI substrate, the inner well being formed under the active layer, the active layer and the inner well being doped with a first type of dopant material, sensing an activity level of the integrated circuit product and applying a voltage of a magnitude and a polarity to the inner well of at least one transistor, the magnitude and polarity of the applied voltage being determined based upon the sensed activity level of the integrated circuit product.

31 Claims, 16 Drawing Sheets

U.S. PATENT DOCUMENTS

| | | | | |
|---|---|---|---|---|
| 5,573,962 | A | * | 11/1996 | Sung .......................... 438/217 |
| 5,753,958 | A | * | 5/1998 | Burr et al. .................... 257/392 |
| 5,869,359 | A | * | 2/1999 | Prabhakar .................. 438/149 |
| 5,923,067 | A | * | 7/1999 | Voldman ..................... 257/349 |
| 6,051,452 | A | | 4/2000 | Shigyo et al. ................ 438/151 |
| 6,063,686 | A | * | 5/2000 | Masuda et al. ............... 438/406 |
| 6,074,920 | A | * | 6/2000 | Houston ...................... 438/289 |
| 6,100,567 | A | * | 8/2000 | Burr ............................. 257/365 |
| 6,172,402 | B1 | | 1/2001 | Gardner et al. .............. 257/347 |
| 6,218,703 | B1 | * | 4/2001 | Sano ............................. 257/347 |
| 6,287,901 | B1 | | 9/2001 | Christensen et al. ........ 438/162 |
| 6,306,691 | B1 | * | 10/2001 | Koh ............................. 438/149 |
| 6,323,110 | B2 | * | 11/2001 | Ling ............................. 438/459 |
| 6,352,882 | B1 | | 3/2002 | Assaderaghi et al. ........ 438/155 |
| 6,410,394 | B1 | * | 6/2002 | Shao et al. .................. 438/289 |
| 6,452,232 | B1 | * | 9/2002 | Adan ............................ 257/347 |
| 6,479,862 | B1 | * | 11/2002 | King et al. .................. 257/321 |
| 6,492,244 | B1 | | 12/2002 | Christensen et al. ........ 438/404 |
| 6,538,268 | B1 | | 3/2003 | Horiuchi ...................... 257/192 |
| 6,555,891 | B1 | | 4/2003 | Furukawa et al. ........... 257/505 |
| 6,670,677 | B2 | | 12/2003 | Choe et al. .................. 257/355 |
| 6,774,705 | B2 | * | 8/2004 | Miyazaki et al. ............ 327/534 |
| 6,875,663 | B2 | | 4/2005 | Iwamatsu et al. ........... 438/298 |
| 2002/0093064 | A1 | * | 7/2002 | Inaba .......................... 257/408 |
| 2002/0105034 | A1 | | 8/2002 | Iwata et al. .................. 257/368 |
| 2003/0016075 | A1 | * | 1/2003 | Itoh ............................. 327/534 |
| 2004/0239394 | A1 | * | 12/2004 | Miyazaki et al. ............ 327/210 |

FOREIGN PATENT DOCUMENTS

| | | |
|---|---|---|
| EP | 0 480 373 A2 | 4/1992 |
| EP | 0 694 977 A2 | 1/1996 |
| EP | 0 749 165 B1 | 1/1996 |
| JP | 09139422 | 5/1997 |
| WO | WO 99/33115 | 7/1999 |

OTHER PUBLICATIONS

Office Action dated Dec. 15, 2003 from U.S. Appl. No. 10/167,184.
Office Action dated Apr. 21, 2004 from U.S. Appl. No. 10/167,184.
Examiner's Answer dated Jan. 26, 2005 from U.S. Appl. No. 10/167,184.
Supplemental Examiner's Answer dated Sep. 8, 2005 from U.S. Appl. No. 10/167,184.
Supplemental Examiner's Answer dated Nov. 9, 2005 from U.S. Appl. No. 10/167,184.
Decision on Appeal dated May 5, 2006 from U.S. Appl. No. 10/167,184.

* cited by examiner

TRANSISTORS WITH CONTROLLABLE THRESHOLD VOLTAGES, AND VARIOUS METHODS OF MAKING AND OPERATING SAME

BACKGROUND OF THE INVENTION

1. Field of the Invention

This invention relates generally to semiconductor fabrication technology, and, more particularly, to transistors with controllable threshold voltages, and various methods of making and operating same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

As transistors are continually scaled in keeping with the requirements of advancing technology, device reliability dictates an associated reduction in the power supply voltage. Hence, every successive technology generation is often accompanied by a reduction in the operating voltage of the transistor. It is known that transistor devices fabricated on silicon-on-insulator (SOI) substrates exhibit better performance at low operating voltages than do transistors of similar dimensions fabricated in bulk silicon substrates. The superior performance of SOI devices at low operating voltage is related to the relatively lower junction capacitances obtained on an SOI device as compared to a bulk silicon device of similar dimensions. The buried oxide layer in an SOI device separates active transistor regions from the bulk silicon substrate, thus reducing junction capacitance.

FIG. 1 depicts an example of an illustrative transistor 10 fabricated on an illustrative silicon-on-insulator substrate 11. As shown therein, the SOI substrate 11 is comprised of a bulk substrate 11A, a buried oxide layer 11B, and an active layer 11C. The transistor 10 is comprised of a gate insulation layer 14, a gate electrode 16, sidewall spacers 19, a drain region 18A, and an source region 18B. A plurality of trench isolation regions 17 are formed in the active layer 11C. Also depicted in FIG. 1 are a plurality of conductive contacts 20 formed in a layer of insulating material 21. The conductive contacts 20 provide electrical connection to the drain and source regions 18A, 18B. As constructed, the transistor 10 defines a channel region 12 in the active layer 11C beneath the gate insulating layer 14. The bulk substrate 11A is normally doped with an appropriate dopant material, i.e., a P-type dopant such as boron or boron difluoride for NMOS devices, or an N-type dopant such as arsenic or phosphorous for PMOS devices. Typically, the bulk substrate 11A will have a doping concentration level on the order of approximately $10^{15}$ ions/cm$^3$. The buried oxide layer 11B may be comprised of silicon dioxide, and it may have a thickness of approximately 50-360 nm (500-3600 Å). The active layer 11C may be comprised of a doped silicon, and it may have a thickness of approximately 5-30 nm (50-300 Å).

Transistors fabricated in SOI substrates offer several performance advantages over transistors fabricated in bulk silicon substrates. For example, complementary-metal-oxide-semiconductor (CMOS) devices fabricated in SOI substrates are less prone to disabling capacitive coupling, known as latch-up. In addition, transistors fabricated in SOI substrates, in general, have large drive currents and high transconductance values. Also, the sub-micron SOI transistors have improved immunity to short-channel effects when compared with bulk transistors fabricated to similar dimensions.

Although SOI devices offer performance advantages over bulk silicon devices of similar dimensions, SOI devices share certain performance problems common to all thin-film transistors. For example, the active elements of an SOI transistor are fabricated in the thin-film active layer 11C. Scaling of thin-film transistors to smaller dimensions requires that the thickness of the active layer 11C be reduced. However, as the thickness of the active layer 11C is reduced, the electrical resistance of the active layer 11C correspondingly increases. This can have a negative impact on transistor performance because the fabrication of transistor elements in a conductive body having a high electrical resistance reduces the drive current of the transistor 10. Moreover, as the thickness of the active layer 11C of an SOI device continues to decrease, variations in the threshold voltage ($V_T$) of the device occur. In short, as the thickness of the active layer 11C decreases, the threshold voltage of the device becomes unstable. As a result, use of such unstable devices in modern integrated circuit devices, e.g., microprocessors, memory devices, logic devices, etc., becomes very difficult if not impossible.

Additionally, off-state leakage currents are always of concern in integrated circuit design, since such currents tend to, among other things, increase power consumption. Such increased power consumption is particularly undesirable in many modern portable consumer devices employing integrated circuits, e.g., portable computers. Lastly, as device dimensions continue to decrease in fully depleted SOI structures, increased short channel effects may occur. That is, in such fully depleted devices, at least some of the field lines of the electric field of the drain 18A tend to couple to the channel region 12 of the transistor 10 through the relatively thick (200-360 nm) buried oxide layer 11B. In some cases, the electric field of the drain 18A may act to, in effect, turn on the transistor 10. Theoretically, such problems may be reduced by reducing the thickness of the buried oxide layer 11B and/or increasing the doping concentration of the bulk substrate 11A. However, such actions, if taken, would tend to increase the junction capacitance between the drain and source regions 18A, 18B and the bulk substrate 11A, thereby negating one of the primary benefits of SOI technology, i.e., reducing such junction capacitance.

Additionally, the threshold voltage ($V_T$) of a transistor is a very important parameter. As a general statement, the threshold voltage is a significant factor as it relates to the operational speed of the transistor and integrated circuit products incorporating such transistors, as well as current leakage and power consumption in such transistors or products. Moreover, the importance of these electrical parameters, e.g., operating speed, leakage current, power consumption, etc., may vary depending upon the nature and requirements of the ultimate consumer product. For example, in mobile computing or telecommunication applications, power consumption is a very important consideration. Thus, at least in some cases, transistors exhibiting higher threshold voltage levels may be desirable for mobile computing and telecommunications applications. In contrast, in very high performance applications, e.g., high-end servers, operating speed may be the most desirable operational characteristic of the integrated circuit product. Thus, in those situations, it may be desirable to make the integrated circuit product with transistors having a relatively low threshold voltage. Existing design techniques try to balance these computing concerns by selecting design parameters such that the resulting transistors and integrated circuit device exhibit performance characteristics that are at least acceptable in terms of such competing interest, even though such performance characteristics may not be ideal for each situation. Alternatively, efforts are made to revise product designs, hopefully on a small scale, to accommodate those competing interests. For example, if an integrated circuit manufacturer receives an order for a number of parts destined for mobile computing and/or telecommunication activities, then the manufacturer may make product modifications in an effort to reduce power consumption, even if it means somewhat of a reduction in operational speed.

The present invention is directed to a device and various methods that may solve, or at least reduce, some or all of the aforementioned problems.

SUMMARY OF THE INVENTION

The present invention is generally directed to transistors with controllable threshold voltages, and various methods of making and operating same. In one illustrative embodiment, the method comprises providing an SOI substrate comprised of an active layer, a buried insulation layer and a bulk substrate, the active layer being doped with a first type of dopant material, the bulk substrate having an inner well formed therein adjacent a surface of the bulk substrate and under the active layer, the inner well being doped with the first type of dopant material, forming a transistor above the SOI substrate in an area above the inner well and applying a voltage to the inner well to vary a threshold voltage of the transistor. In some embodiments, the method further comprises forming an NMOS transistor, wherein the active layer and the inner well are doped with a P-type dopant material. In other embodiments, the method further comprises forming a PMOS transistor, wherein the active layer and the inner well are doped with an N-type dopant material. In even further embodiments, the method further comprises applying a voltage to the inner well that falls within a range, inclusively, from positive drain voltage ($+V_{dd}$) to negative drain voltage ($-V_{dd}$).

In another illustrative embodiment, the method comprises providing a consumer product comprised of at least one integrated circuit product, the integrated circuit product being comprised of at least one transistor formed in an active layer of an SOI substrate, the SOI substrate further comprising an inner well formed adjacent a surface of a bulk substrate of the SOI substrate, the inner well being formed under the active layer, the active layer and the inner well being doped with a first type of dopant material, sensing an activity level of the integrated circuit product and applying a voltage of a magnitude and a polarity to the inner well of at least one transistor, the magnitude and polarity of the applied voltage being determined based upon the sensed activity level of the integrated circuit product. In some embodiments, the consumer product comprises at least one of a personal computer, a portable computer, a mobile telephone, a digital camera, a personal digital assistant and a wireless internet appliance, and the integrated circuit product is at least one of a microprocessor, a digital signal process, an application-specific integrated circuit product, a memory array and a logic device.

BRIEF DESCRIPTION OF THE DRAWINGS

The invention may be understood by reference to the following description taken in conjunction with the accompanying drawings, in which like reference numerals identify like elements, and in which.

Figure 1:
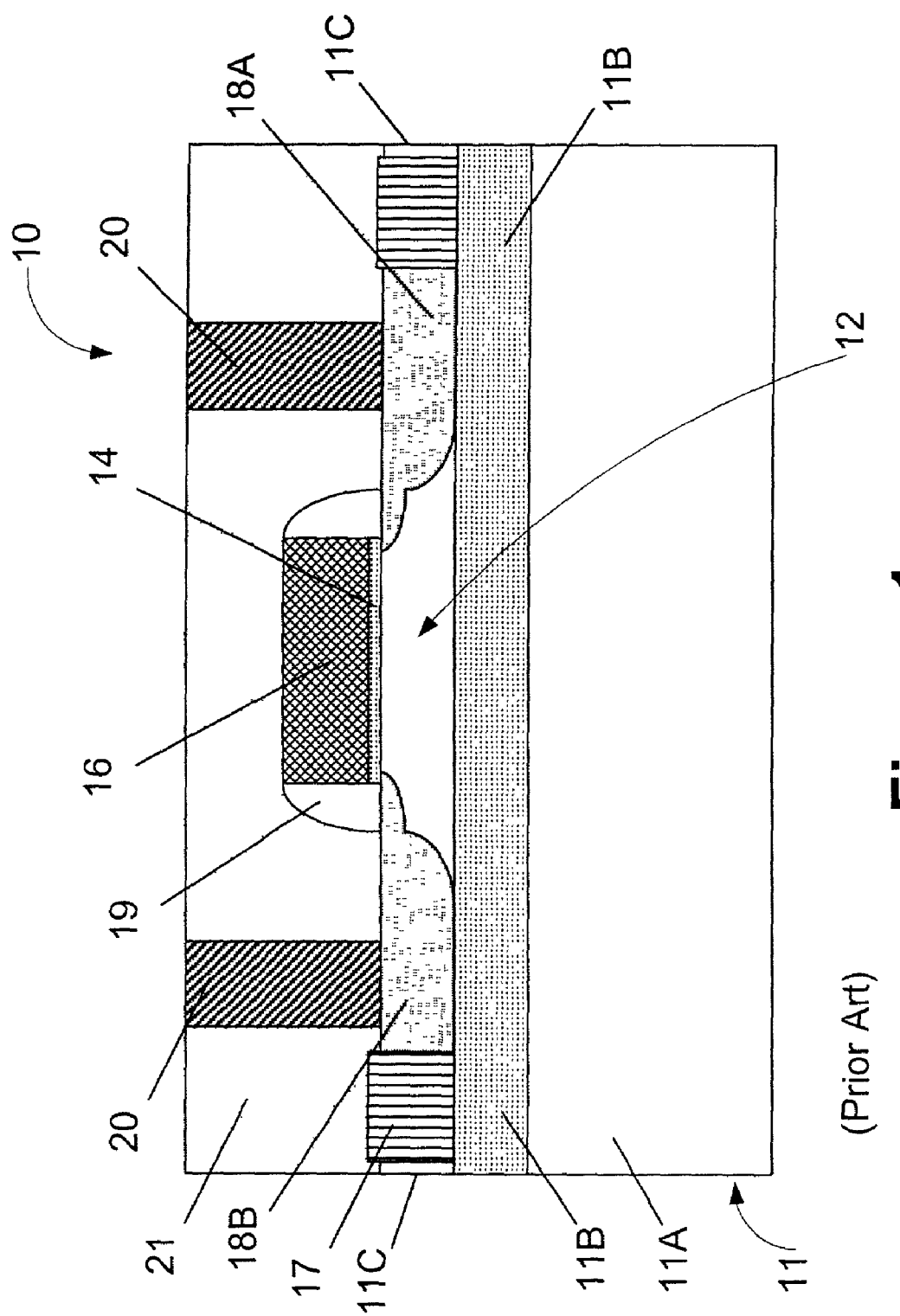
FIG. 1 is a cross-sectional view of an illustrative prior art semiconductor device formed above an SOI substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to, in one embodiment, fully depleted transistors with controllable threshold voltages, and various methods of making and operating same. Although the present invention will be initially disclosed in the context of the formation of an illustrative NMOS transistor, those skilled in the art will understand after a complete reading of the present application that the present invention is not so limited. More particularly, the present invention may be employed with respect to a variety of technologies, e.g., NMOS, PMOS, CMOS, etc., and it may be employed with a variety of different type devices, e.g., memory devices, microprocessors, logic devices, etc.

Figure 2A:
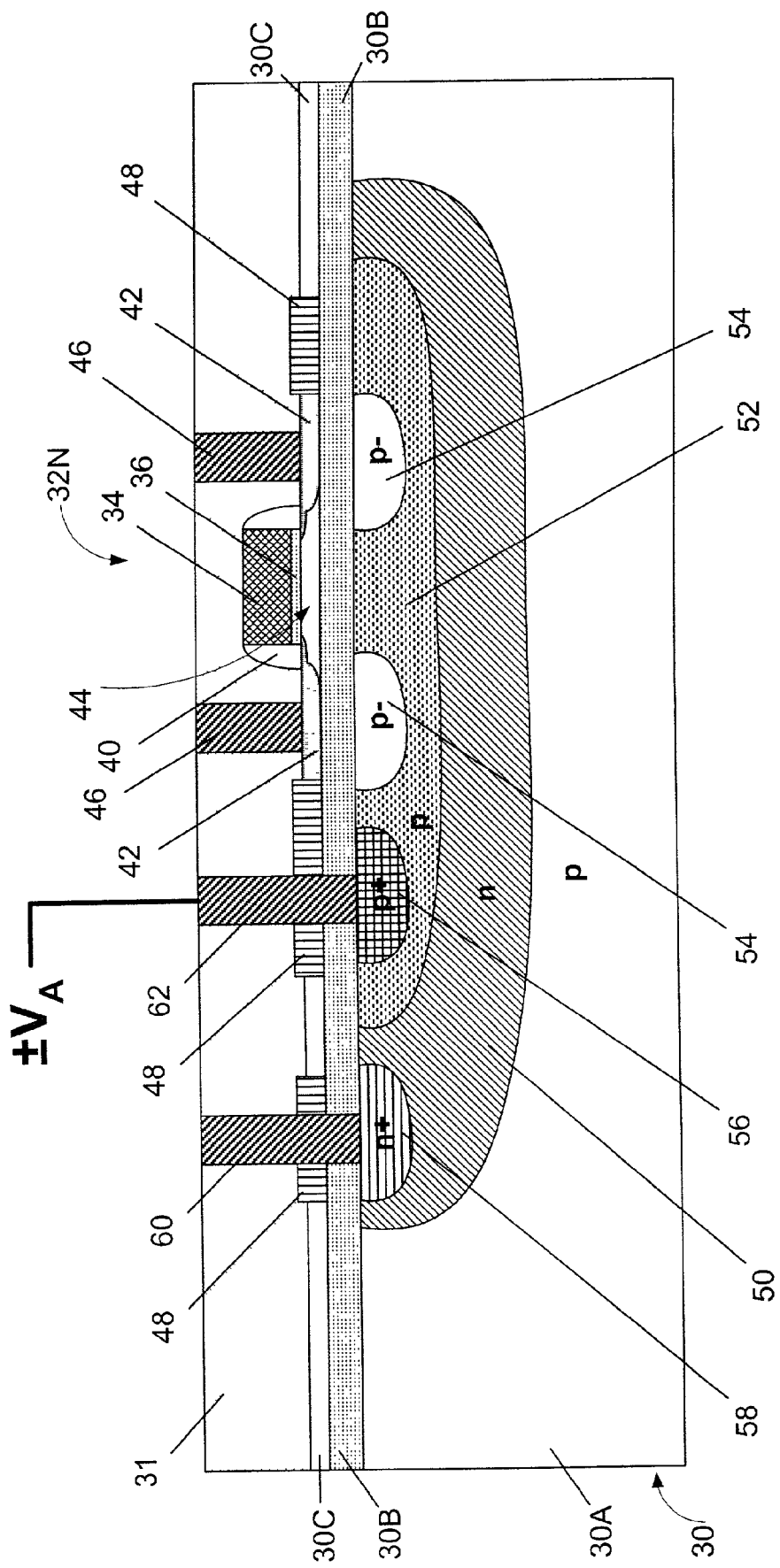
FIGS. 2A-2F are cross-sectional views depicting one illustrative method of the present invention for forming portions of an illustrative NMOS semiconductor device above an SOI substrate with a P-doped bulk substrate.
Figure 3A:
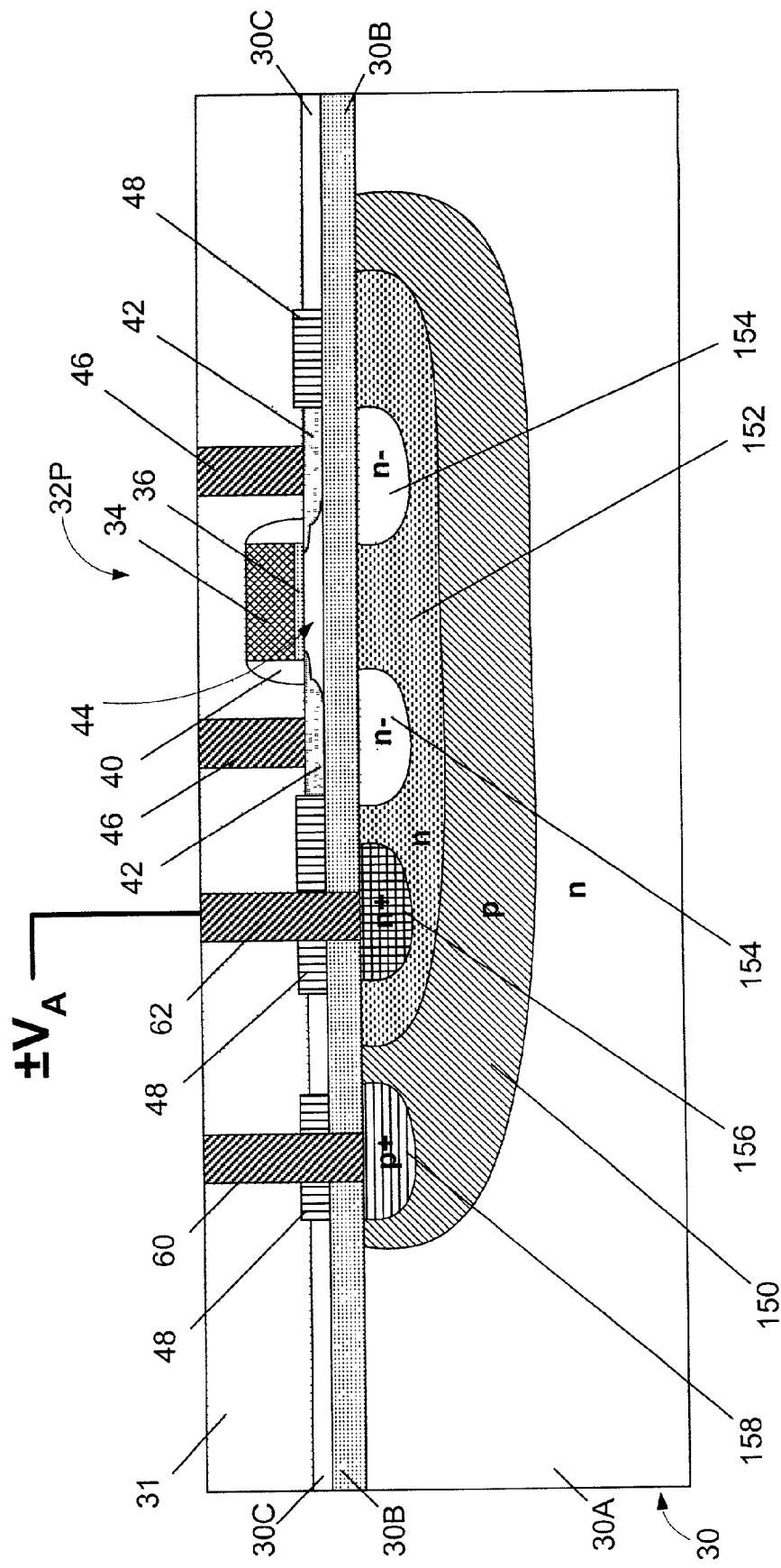
FIGS. 3A-3F are cross-sectional views depicting one illustrative method of the present invention for forming portions of an illustrative PMOS semiconductor device above an SOI substrate with an N-doped bulk substrate.
Figure 4:
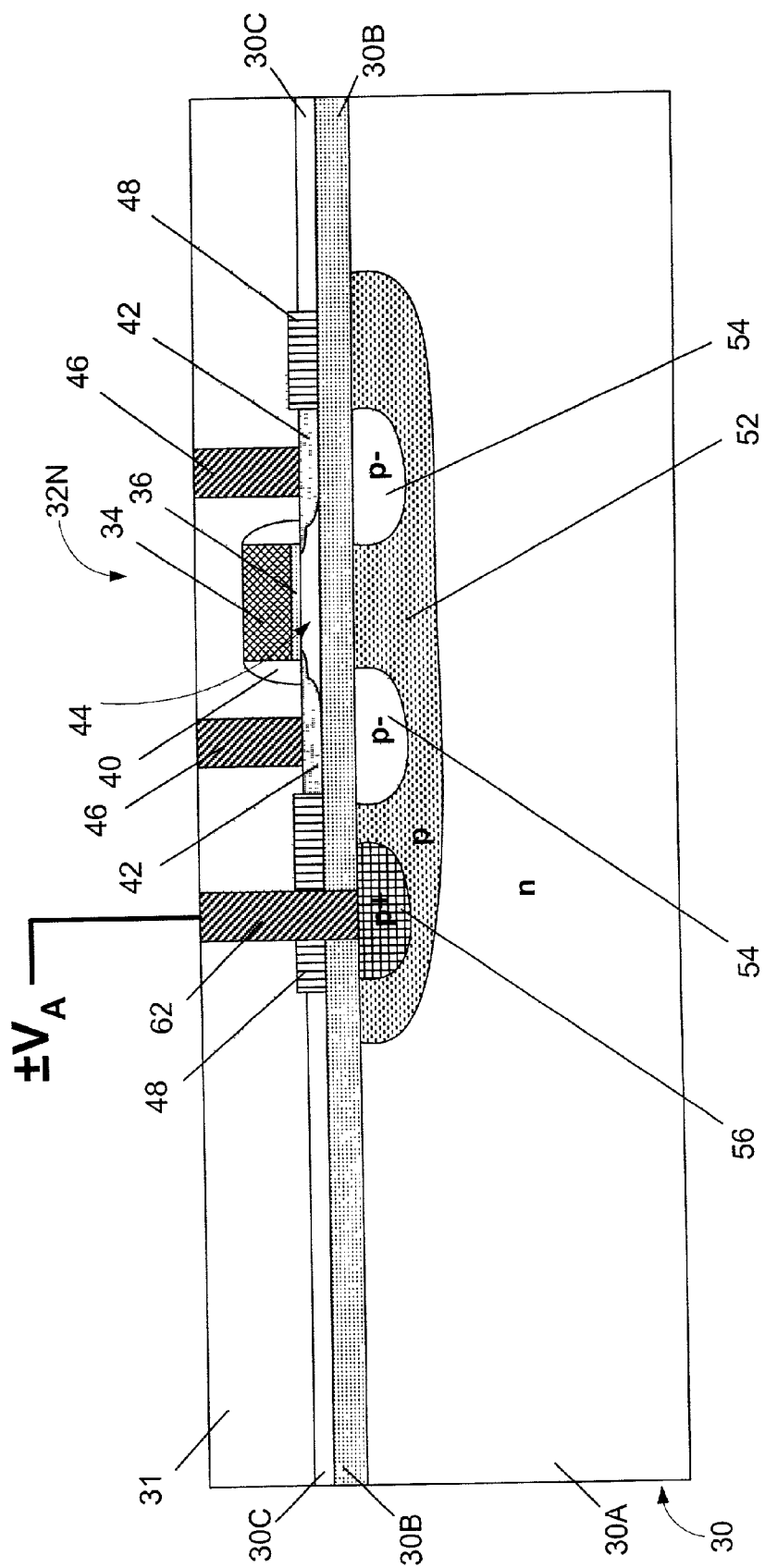
FIG. 4 is a cross-sectional view of an illustrative NMOS semiconductor device above an SOI device with an N-doped bulk substrate.
Figure 5:
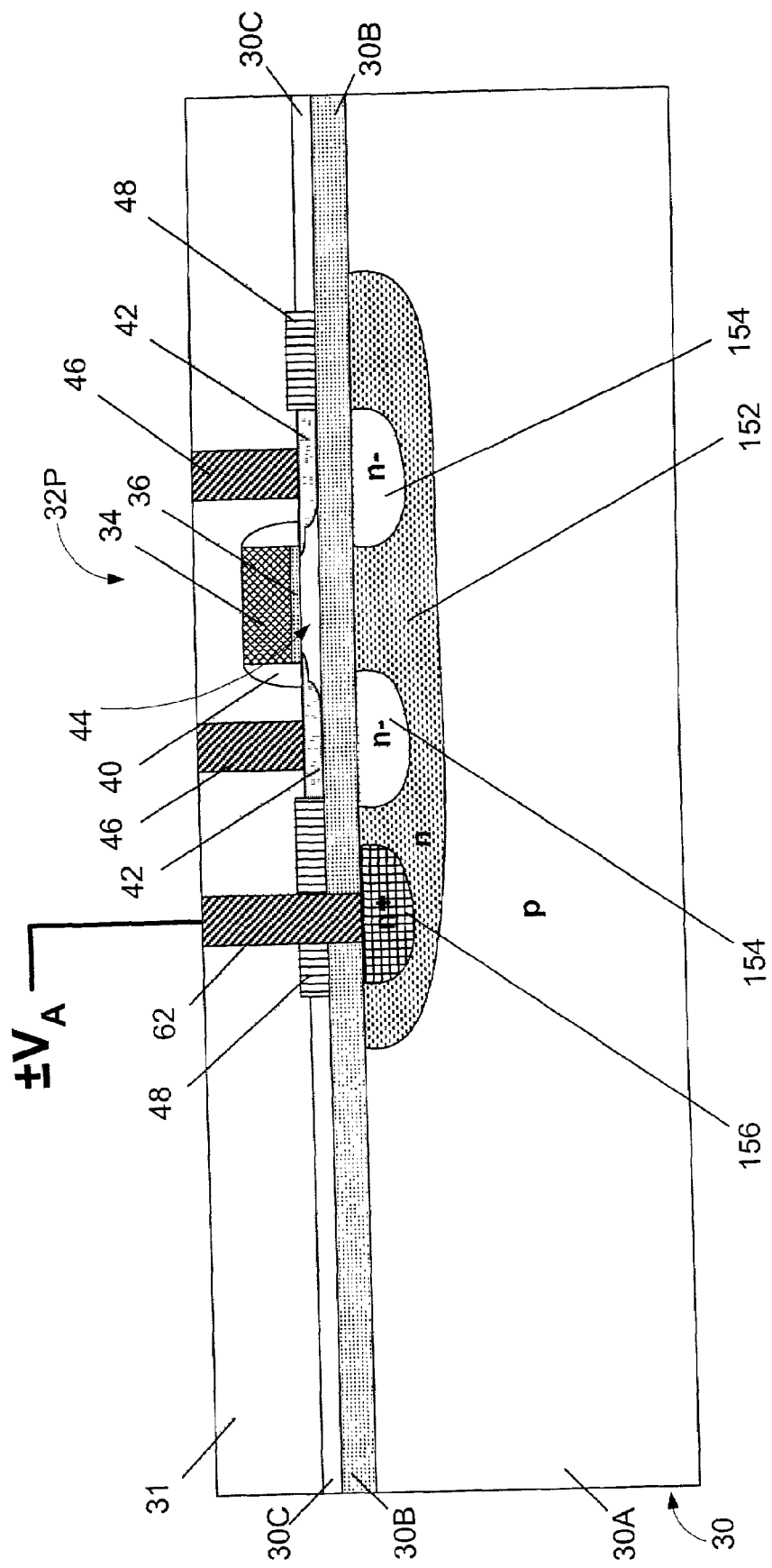
FIG. 5 is a cross-sectional view of an illustrative PMOS semiconductor device above an SOI device with a P-doped bulk substrate.

FIG. 2A depicts an illustrative NMOS transistor 32N formed above an SOI substrate 30 with a P-doped bulk substrate 30A. FIG. 3A depicts an illustrative PMOS transistor 32P formed above an SOI substrate 30 having an N-doped bulk substrate 30A. FIG. 4 depicts an illustrative NMOS transistor 32N formed above an SOI substrate 30 having an N-doped bulk substrate 30A. FIG. 5 depicts an illustrative PMOS transistor 32P formed above an SOI substrate 30 having a P-doped bulk substrate 30A. Although not depicted in the attached drawings, in a CMOS application, the NMOS transistor 32N of FIG. 2A may be formed adjacent the PMOS transistor 32P depicted in FIG. 5. Similarly, the PMOS transistor 32P depicted in FIG. 3A may be formed adjacent the NMOS transistor 32N depicted in FIG. 4 in a CMOS application. The physical structure of the various transistors and the operational characteristics of such transistors will be described initially. Thereafter, various illustrative methods for using and forming such transistors will be disclosed.

As shown in FIG. 2A, the illustrative NMOS transistor 32N is formed above an SOI substrate 30. In one illustrative embodiment, the SOI substrate 30 is comprised of a bulk substrate 30A, a buried insulation layer 30B, and an active layer 30C. Of course, FIG. 2A only depicts a small portion of an entire substrate or wafer. In the illustrative embodiment where an NMOS device is formed, the bulk substrate 30A may be doped with a P-type dopant material, e.g., boron, boron difluoride, etc., and it my have a dopant concentration of approximately $10^{15}$ ions/cm$^3$. The buried insulation layer 30B may have a thickness that, in one embodiment, varies from approximately 5-50 nm (50-500 Å), and it may be comprised of, for example, silicon dioxide. However, the recited details of the construction of the SOI substrate 30 should not be considered a limitation of the present invention unless such limitations are specifically set forth in the appended claims.

The active layer 30C may have a thickness that varies from approximately 5-30 nm (50-300 Å), and, in the case of an NMOS device, it may be doped with a P-type dopant material at a concentration level of approximately $10^{17}$ ions/cm$^3$. In practice, the SOI substrate 30 may be provided to a semiconductor manufacturer with a nominal level of dopant material, e.g., approximately $10^{15}$ ions/cm$^3$ of the appropriate dopant material, i.e., P-type or N-type dopant material. Thereafter, the integrated circuit manufacturer, using appropriate masking techniques, may perform one or more ion implant processes to increase the dopant concentration of the active layer 30C to approximately $10^{17}$ ions/cm$^3$ of the appropriate dopant material, e.g., N-type or P-type, in various desired areas of the active layer 30C, using appropriate masking layers (not shown) when needed. As those skilled in the art will recognize, different type transistors, i.e., NMOS and PMOS transistors, will be formed in and above the active layer 30C having localized regions doped with P-type and N-type dopant material, respectively.

As shown in FIG. 2A, the transistor 32N is comprised of a gate insulation layer 36, a gate electrode 34, sidewall spacers 44 and source/drain regions 42. Also depicted in FIG. 2A are isolation regions 48 formed in the active layer 30C, a plurality of conductive contacts 46 formed in a layer of insulating material 31, and additional contacts 60, 62 and 63. As will be recognized by those skilled in the art, the contacts 46 provide a means for establishing electrical contact with the source/drain regions 42 of the transistor 32.

According to, the present invention, in one embodiment, a plurality of doped wells are formed in the bulk substrate 30A. More particularly, as depicted in FIG. 2A, for an illustrative CMOS device, the bulk substrate 30A is typically manufactured with a P-type dopant material, such as boron or boron difluoride, at a concentration level of approximately $10^{12}$-$10^{16}$ ion/cm$^3$. A first well or outer well 50, a second well or inner well 52, a plurality of source/drain wells 54, and a plurality of contact wells 56, 58 are formed in the bulk substrate 30A in accordance with the methods disclosed herein. In the case of an illustrative NMOS transistor, the first well or outer well 50 may be doped with an N-type dopant material, such as arsenic or phosphorous, at a dopant concentration level of approximately $10^{16}$-$10^{19}$ ions/cm$^3$. Again, in the case of an NMOS device, the second well or inner well 52 may be doped with a P-type dopant material, e.g., boron or boron difluoride, at a dopant concentration level of approximately $10^{17}$-$10^{20}$ ions/cm$^3$. It should be noted that the inner well 52 and the active layer 30C positioned thereabove are doped with the same type of dopant material. However, the particular dopant species, e.g., boron or boron difluoride, may be the same as or different from the dopant species used to dope the active layer 30C with P-type dopant material. The source/drain wells 54 may be formed by various counter doping methods to be described more fully herein wherein the resulting concentration of the source/drain wells 54 ranges from approximately $10^{15}$-$10^{18}$ ions/cm$^3$ of a P-type dopant material for an NMOS device. However, at least for certain aspects of the present invention, the source/drain wells 54 are not required, although they may be included if desired. Thus, the particular wells depicted in the attached drawings should not be considered a limitation of the present invention unless such limitations are clearly set forth in the appended claims.

The contact well 56 may be doped with a P-type dopant material at a relatively high concentration, e.g., $2 \times 10^{20}$ or greater ions/cm$^3$. Similarly, the N-type contact well 58 may be doped with a (similar concentration level of N-type dopant atoms, e.g., arsenic, phosphorous, etc. As will be recognized by those skilled in the art after a complete reading of the present application, the various components of the transistor, e.g., the gate electrode 34 and the gate insulation layer 36, including the manner in which they are made and the materials of construction, are well-known to those skilled in the art and, thus, should not be considered a limitation of the present invention unless such limitations are specifically set forth in the appended claims.

FIG. 3A depicts the present invention in the illustrative embodiment of a PMOS transistor 32P comprised of a gate insulation layer 36, a gate electrode 34, sidewall spacers 44 and source/drain regions 43. Also depicted in FIG. 3A are isolation regions 48 formed in the active layer 30C, a plurality of conductive contacts 46 formed in a layer of insulating material 31, and additional contacts 60 and 62. As depicted in FIG. 3A, for an illustrative PMOS device, the bulk substrate 30A may be doped with an N-type dopant material, such as arsenic or phosphorous, at a concentration level of approximately $10^{15}$ ions/cm$^3$. The active layer 30C wherein the transistor 32P will be formed is also doped with an N-type dopant material at a concentration level of approximately $10^{17}$ ions/cm$^3$. A first well or outer well 150, a second well or inner well 152, source/drain wells 154 (if used), and contact wells 156, 158 (if used) are formed in the bulk substrate 30A in accordance with the methods disclosed herein. In the case of an illustrative PMOS transistor, the first well or outer well 150 may be doped with a P-type dopant material, such as boron or boron difluoride, at a dopant concentration level of approximately $10^{17}$-$10^{20}$ ions/cm$^3$. Again, in the case of a PMOS device, the second well or inner well 152 may be doped with an N-type dopant material, e.g., arsenic or phosphorous, at a dopant concentration level of approximately $10^{16}$-$10^{19}$ ions/cm$^3$. That is, the inner well 152 is doped with the same type of dopant material, i.e., N-type, as that of active layer 30C in which the transistor 32P will be formed. However, the particular dopant species used in the active layer 30C and the inner well 152 may be the same or they may be different from one another.

The source/drain wells 154 (if used) may be formed by various counter doping methods to be described more fully herein wherein the resulting concentration of the source/drain wells 54 ranges from approximately $10^{14}$-$10^{17}$ ions/cm$^3$ of an N-type dopant material for a PMOS device. The contact well 156 may be doped with an N-type dopant material at a relatively high concentration, e.g., $2\times10^{20}$ or greater ions/cm$^3$. Similarly, the P-type contact well 158 may be doped with a similar concentration level of P-type dopant atoms, e.g., boron, boron difluoride, etc. As will be recognized by those skilled in the art after a complete reading of the present application, the various components of the transistor 32P, including the manner in which they are made and the materials of construction, are well-known to those skilled in the art and, thus, should not be considered a limitation of the present invention unless such limitations are specifically set forth in the appended claims.

FIG. 4 depicts an illustrative NMOS transistor 32N formed above an SOI substrate 30 wherein the bulk substrate 30A is doped with an N-type dopant material. In this embodiment, the active layer 30C (between the isolation regions 48) is doped with a P-type dopant material, e.g., boron, boron difluoride, etc. In this embodiment, since the bulk substrate 30A is doped with an N-type dopant material, the first well or outer well 50 depicted in FIG. 2A may be omitted. The second well or inner well 52 in the embodiment depicted in FIG. 4 may be doped with a P-type dopant material, e.g., boron, boron difluoride, etc., and it may have a dopant concentration level of approximately $10^{17}$-$10^{20}$ ions/cm$^3$. As with the other embodiments, the inner well 52 depicted in FIG. 4 is doped with the same type of dopant material as that of the active layer 30C although different dopant species may be used in each region.

FIG. 5 depicts an illustrative PMOS transistor 32P formed above an SOI substrate 30 wherein the bulk substrate 30A is doped with a P-type dopant material. In this embodiment, the active layer 30C (between the isolation regions 48) is doped with an N-type dopant material, e.g., arsenic, phosphorous, etc. In this embodiment, since the bulk substrate 30A is doped with a P-type dopant material, the first well or outer well 150 depicted in FIG. 3A may be omitted. The second well or inner well 152 in the embodiment depicted in FIG. 5 may also be doped with an N-type dopant material, e.g., arsenic, phosphorous, etc., and it may have a dopant concentration level of approximately $10^{17}$-$10^{20}$ ions/cm$^3$.

As a general statement, the threshold voltages ($V_T$) of the various transistors depicted in FIGS. 2A, 3A, 4 and 5 may be dynamically controlled by applying a voltage ($\pm V_A$) to the second well or inner well 52, 152 of the various devices. That is, by biasing the inner wells 52, 152, the threshold voltage ($V_T$) of the various transistor devices may be modified depending upon the desired performance characteristics of the transistor devices. For example, applying a positive voltage ($+V_A$) to the P-doped inner well 52 (depicted in FIG. 2A or 4) will reduce the threshold voltage ($V_T$) of the NMOS transistor 32N, thereby tending to enhance the switching speed or operating frequency of the transistor 32N. Conversely, applying a negative voltage ($-V_A$) to the inner well 52 cause the threshold voltage ($V_T$) of the NMOS transistor 32N to increase, thereby tending to decrease the off-state leakage currents and power consumption of the device.

Similarly, well biasing operations may be performed on the PMOS devices 32P disclosed herein. More particularly, applying a negative voltage ($-V_A$) to the N-doped inner well 152 (depicted in FIG. 3A or 5) of the PMOS transistor 32P will tend to decrease the threshold voltage ($V_T$) of the transistor 32P, thereby tending to increase the operating frequency of the device. Conversely, applying a positive voltage ($+V_A$) to the inner well 152 will increase the threshold voltage ($V_T$) of the device, thereby tending to reduce leakage currents and power consumption.

The magnitude and polarity of the applied voltage ($V_A$) may vary depending upon the particular device. In general, the applied voltage ($V_A$) for the devices may be a voltage that falls within a range, inclusively, of plus or minus the drain voltage of the device, i.e., $\pm V_{dd}$. As a more specific example, wherein $V_{dd}$=1.2 V, the positive applied voltage ($+V_A$) may range from approximately +0.6-+0.08 volts, whereas the negative applied voltage ($-V_A$) may range from approximately −0.6--0.8 volts. Additionally, the magnitude of applied voltage ($V_A$) may vary depending on the type of device at issue, i.e., NMOS, PMOS. However, it should be understood that these illustrative voltage levels are representative in nature, and they should not be considered a limitation of the present invention unless such limitations are expressly set forth in the appended claims.

Through use of the present invention, the threshold voltage ($V_T$) of the various transistors 32N, 32P depicted herein may be dynamically controlled, thereby allowing control of the electrical characteristics of the resulting integrated circuit product. That ability is desirable in many respects. For example, in some product applications, low leakage currents and power consumption is of paramount importance, e.g., mobile computing and telecommunication applications. In those situations, the threshold voltage ($V_T$) of some or all of the various transistors that are part of the completed integrated circuit product, e.g., microprocessor, digital signal processor, ASICs, etc., used to make the ultimate consumer product may be increased or set at a relatively high value to thereby reduce such leakage currents and unwanted power consumption. Conversely, in applications where operating performance is of greatest concern, e.g., high-end servers, workstations, desktop computers, etc., the threshold voltage ($V_T$) of some or all of the transistors 32N, 32P that comprise the resulting integrated circuit product may be reduced or set at a relatively low level to thereby increase the operating frequency or speed of the particular integrated circuit product.

In one illustrative embodiment, the applied voltage ($V_A$) may be determined by a manufacturer based upon the desired operating characteristics of the ultimate consumer product. For example, an original equipment manufacturer (OEM)

may be provided with an integrated circuit product, e.g., a microprocessor, a digital signal processor, an application-specific integrated circuit, a memory array, etc., to be included in a consumer product, e.g., a high-end server, a mobile telephone, a portable computer, etc. Based upon the desired performance characteristics of the ultimate consumer product, e.g., the portable computer, the OEM may fuse together certain elements of the integrated circuit product such that it tends to exhibit the desired characteristics. For example, in the case where a digital signal processor (DSP) may be earmarked for a mobile telephone application, the OEM may fuse or wire the DSP such that some or all of the transistors 32N, 32P comprising the DSP exhibit low leakage currents and low power consumption. As yet another example, an OEM of high-performance servers may fuse or wire a microprocessor such that some or all of the transistors 32N, 32P of one or more microprocessors or ASICs within the server exhibit very high operating speed characteristics. Such capability provides an OEM with greater flexibility in providing consumer products that exhibit the desired electrical characteristics, and it provides the OEM with greater flexibility for adapting to changes in consumer demands with respect to various types of products. The physical steps used to fuse or wire the integrated circuit product such that the appropriate voltage ($V_A$)) may be applied to the appropriate transistors 32N, 32P within an integrated circuit product are well known to those skilled in the art.

In another illustrative embodiment, the present invention is directed to an integrated circuit product wherein the threshold voltage ($V_T$) of some or all of the transistors that comprise the integrated circuit product, e.g., microprocessor, DSP, etc., may be controlled or varied based upon the current operating condition of the integrated circuit product and/or the ultimate consumer device. For example, in the case of a portable computer, when the computer is essentially idle, a voltage ($V_A$) may be applied to some or all of the inner wells 52, 152 to increase the threshold voltage ($V_T$) of the transistors 32N, 32P within an integrated circuit product, e.g., microprocessor, such that the leakage current and power consumption of the integrated circuit product is reduced, thereby conserving battery resources. Alternatively, when an application program is actually being used on the portable computer, at least above some preselected level of activity, the applied voltage ($V_A$) to some or all of the transistors 32N, 32P of the integrated circuit product may be changed such that the threshold voltage ($V_T$) of some or all of the transistors 32N, 32P may be decreased, thereby tending to increase the operating frequency of the integrated circuit product and the speed of the ultimate consumer device. In short, in this embodiment, a product may be provided with a mode selection capability wherein the desired electrical performance characteristics of the ultimate consumer device and of integrated circuit products within the ultimate consumer device may be varied depending upon real-time or near real-time operating characteristics of the ultimate consumer device, e.g., portable computer, high-end server, desktop computer, mobile telephone, etc.

Further detailed control algorithms may be employed in this context also. For example, in the case described above for a portable computer, the applied voltage ($V_A$) was adjusted so as to increase the speed of the portable computer when it was sensed or determined that an application program, e.g., Microsoft Word®, was running. However, in some situations, it may be desirable to avoid selecting the "high-performance" mode of operation. For example, a control algorithm may be established wherein if the power remaining in the batteries of the portable computer gets too low, then the portable computer cannot be configured to the "high-performance" mode.

Figure 6:
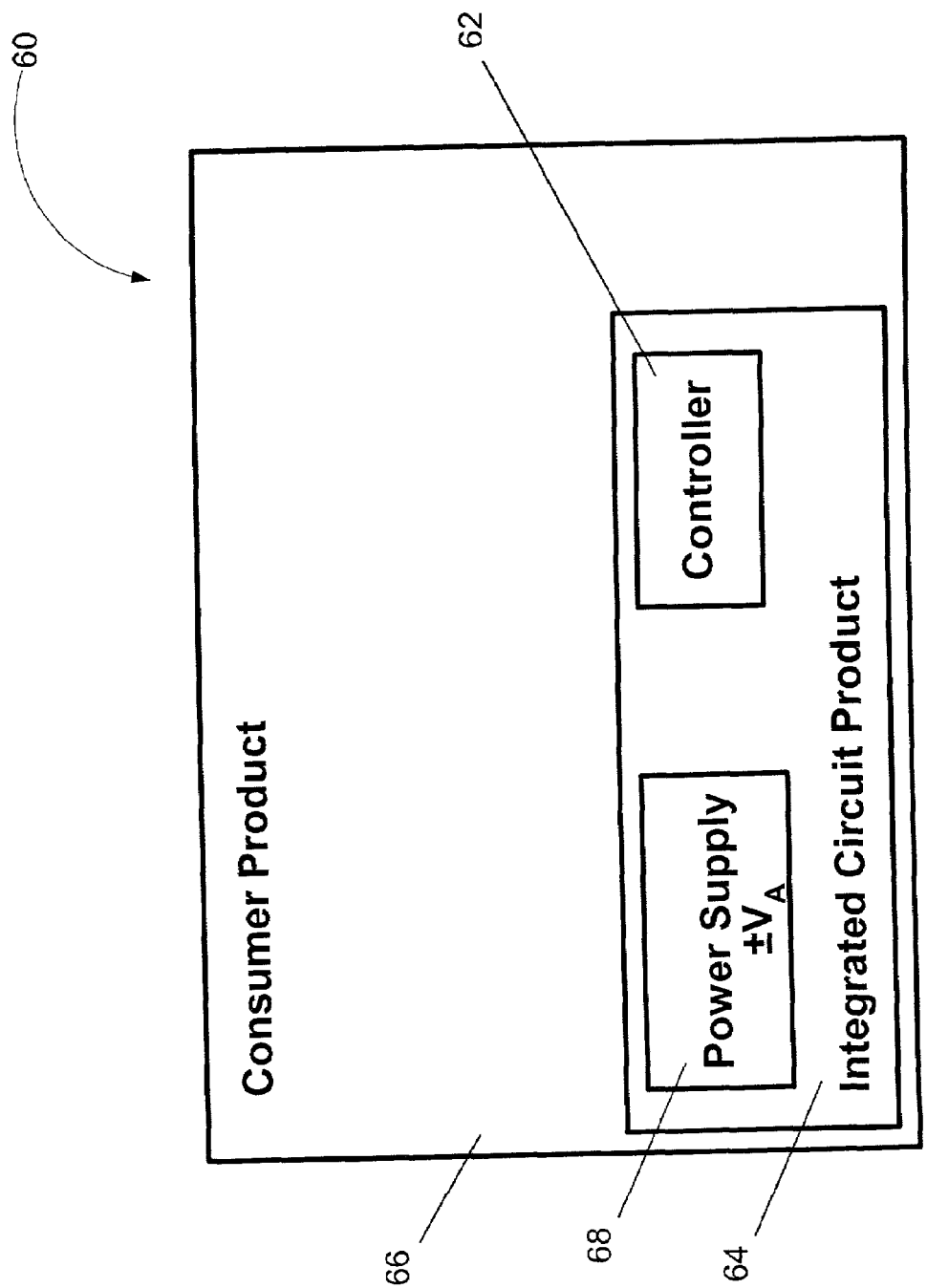
FIG. 6 is a schematic depiction of an illustrative system in which the present invention may be employed.

FIG. 6 is a schematic, block diagram depiction of an illustrative system 60 in which the present invention may be employed. As shown therein, the system 60 is comprised of a controller 62 that is operatively coupled to an integrated circuit product 64 that is part of a completed consumer product 66. The integrated circuit product 64 is intended to be representative of any of a vast variety of integrated circuit products, e.g., a microprocessor, a DSP, an ASIC, a memory array, a logic device, etc. Thus, the particular type of integrated circuit product 64 should not be considered a limitation of the present invention unless such a limitation is clearly set forth in the appended claims. Additionally, although a single integrated circuit product 64 is depicted in FIG. 6, it is to be understood that it is representative of one or more such integrated circuit products 64 that may be present within the consumer product 66.

It should also be understood that the consumer product 66 depicted in FIG. 6 is representative of any type of product that may employ integrated circuit products 64, e.g., personal computers, servers, mobile telephones, portable computers, digital cameras, etc. Thus, the particular type of consumer product used with the present invention should not be considered a limitation unless such limitations are clearly set forth in the appended claims.

In general, the controller 62 is adapted to sense, or be provided with, the operational activity of the integrated circuit product 64 within the consumer product 66. Based upon the sensed or detected level of activity of the integrated circuit product 64, the controller 62 may supply the appropriate voltage ($\pm V_A$) from the power supply 68 to one or more of the transistors 32N, 32P that make up the integrated circuit product 64 to adjust the electrical performance characteristics, i.e., performance mode, of the integrated circuit product 64 to a performance level that best fits the sensed activity level of the integrated circuit product 64. For example, in the illustrative case when the integrated circuit product 64 is a microprocessor, the controller 62 may sense (or be provided with) the number of times the microprocessor is accessed, or required to execute an instruction, over a given time period. Based upon various control rules (that may vary depending upon the particular integrated circuit product and the particular application in which it is used), the controller 62 may switch the integrated circuit product 64 to a "high performance" mode of operation if the sensed access rate exceeds a preselected limit. To accomplish this, the controller 62 may execute instructions that direct the appropriate applied voltage ($V_A$) be directed to at least some of the transistors 32N, 32P within the integrated circuit product 64. If the access rate of the microprocessor falls below a certain preselected limit, the controller 62 may adjust the applied voltage ($V_A$) such that the integrated circuit product 64 goes into a "power saving" mode.

The actions taken by the controller 62 may be accomplished with hardware or software or a combination of both. In the illustrated embodiments, the controller 62 is a collection of logic circuitry that is capable of processing the appropriate software to implement the functions described herein. That is, the controller 62 is capable of detecting the desired mode of operation (based upon a predetermined, programmed algorithm) and adjusting the applied well bias ($V_A$) to the transistor to achieve the desired mode of operation. In the depicted embodiment, the controller 62 is shown as part of the integrated circuit product 64. However, other embodiments are also possible. For example, the controller 62 may be part of a separate integrated circuit product (not shown), i.e., a controller chip-set or the like, within the consumer product 66. Similarly, the power supply 68 is depicted as part of the integrated circuit product 64. However, those skilled in the art recognize that the power supply 68 could be from an external source or generator.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Figure 2B:
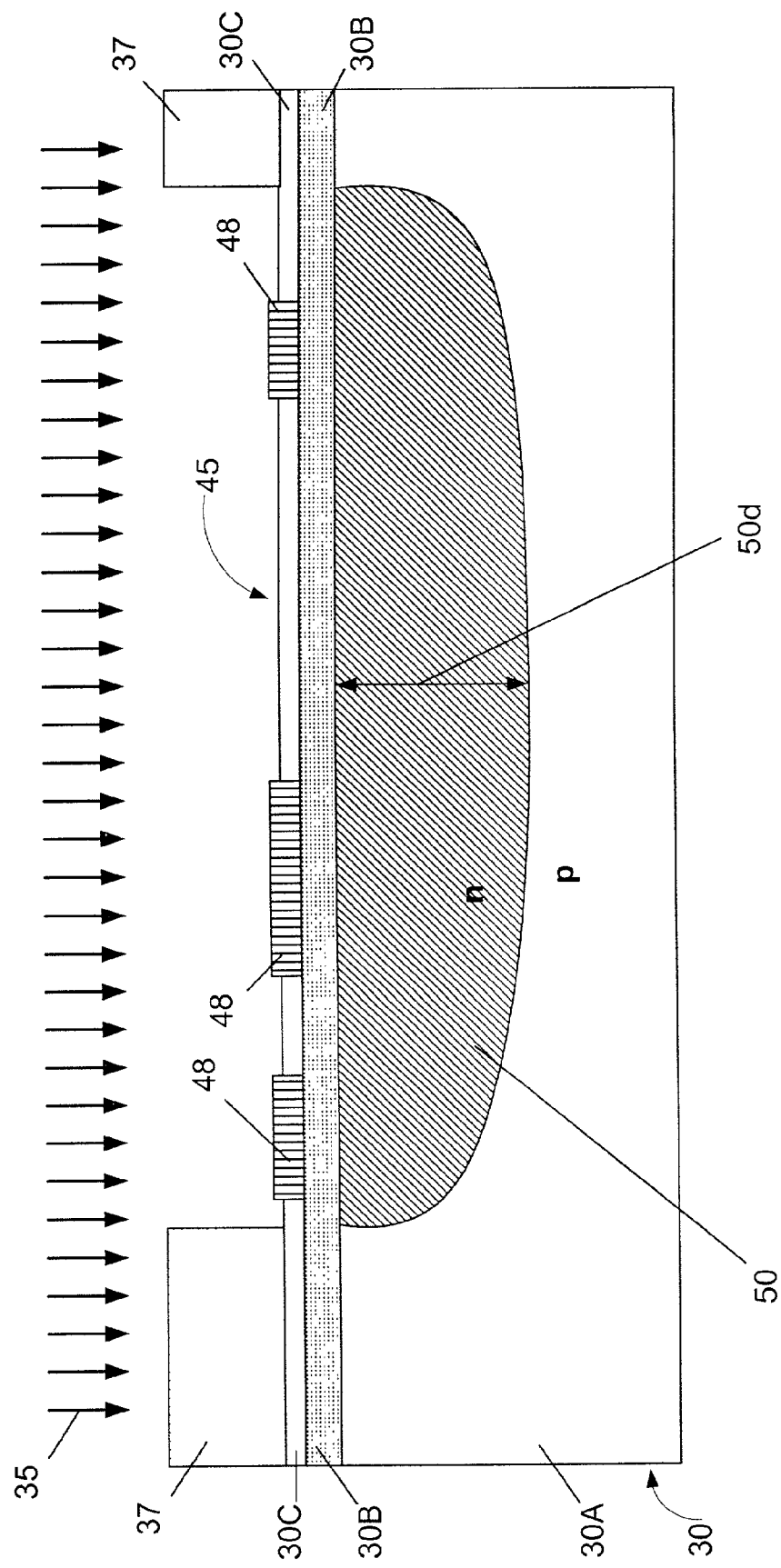

One illustrative method for forming the illustrative NMOS transistor 32N depicted in FIG. 2A will now be described with reference to FIGS. 2B-2F. Initially, as shown in FIG. 2B, a masking layer 37 is formed above the active layer 30C of the substrate 30. The masking layer 37 may be comprised of a variety of materials, such as photoresist. Thereafter, an ion implant process 35 may be performed to form the first well 50 in the bulk substrate 30A. The first well 50 may have a depth 50$d$ that varies from approximately 50-150 nm. Again, in the context of the formation of an NMOS device, the ion implant process 35 may be performed using an N-type dopant material, such as arsenic, phosphorous, etc., at a dopant dose of approximately 5 $e^{10}$-1.5$e^{14}$ ions/cm$^2$. The resulting first well 50 has a dopant concentration level that ranges from approximately 10$^{16}$-10$^{19}$ ions/cm$^3$. The implant energy used during the ion implant process 35 will vary depending upon the species of dopant atoms implanted. In the illustrative embodiment where phosphorous is the dopant material, the implant energy may vary from approximately 20-100 keV.

Figure 2C:
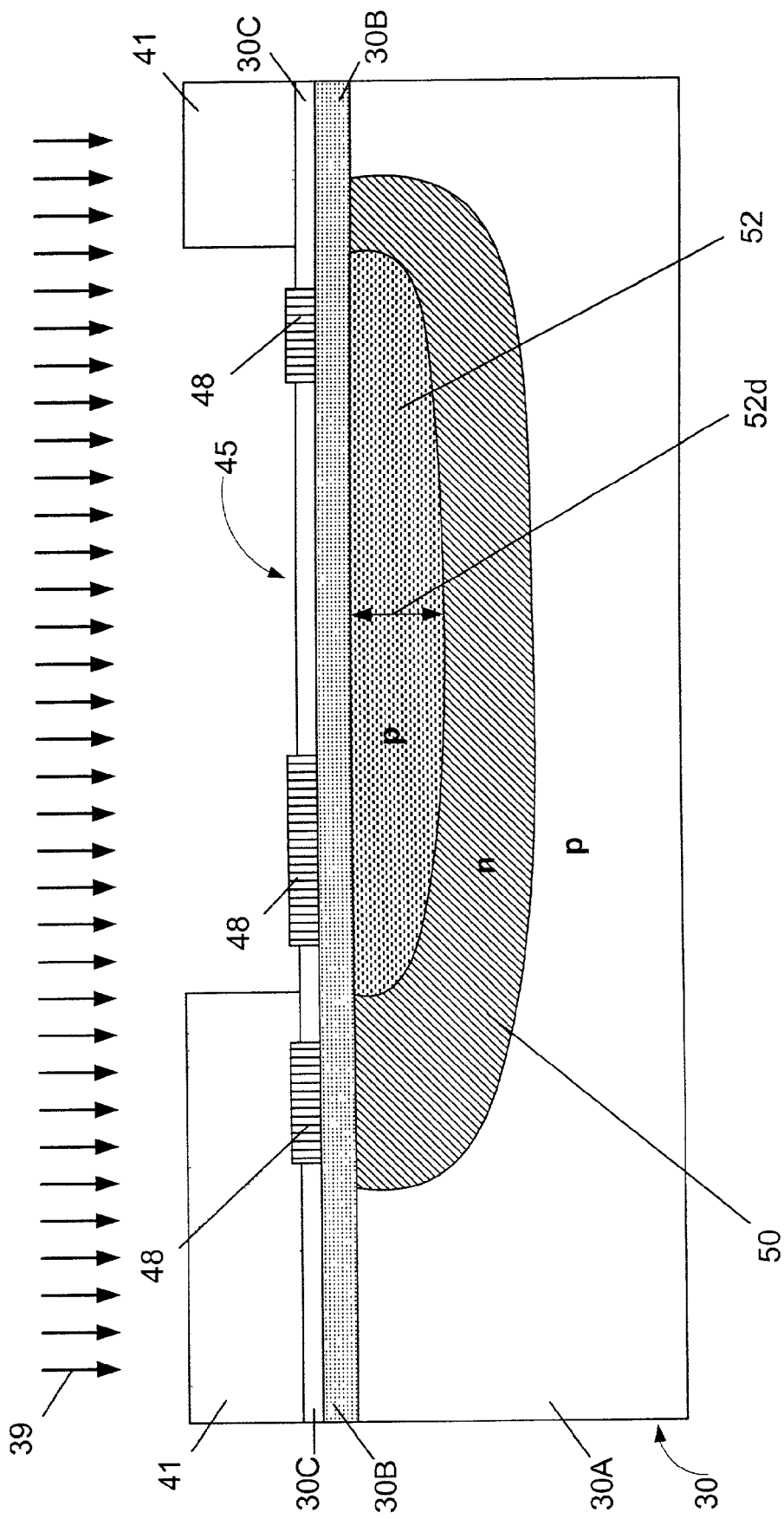

Next, the masking layer 37 depicted in FIG. 2B is removed and another masking layer 41 is formed above the active layer 30C of the substrate 30, as shown in FIG. 2C. Thereafter, another ion implant process, as indicated by arrows 39, is performed to form the second well 52 in the bulk substrate 30A. The second well 52 is doped with a second type of dopant material that is a type opposite to that of the dopant material used in the first well 50. In the case of an illustrative NMOS transistor, the second well 52 may be doped with a P-type dopant material, such as boron, boron difluoride, etc. The second well 52 may have a depth 52$d$ that varies from approximately 40-100 nm. In one illustrative embodiment, the second well 52 has a dopant concentration of approximately 10$^{17}$-10$^{20}$ ions/cm$^3$. In the context of the formation of an NMOS device, the ion implant process 39 may be performed with a P-type dopant material, e.g., boron, boron difluoride, etc., at a dopant dose of approximately 4 $e^{11}$-1 $e^{15}$ ions/cm$^2$. The implant energy used during the implant process 39 will vary depending upon the species of the dopant atoms implanted. In the illustrative embodiment where boron is the dopant material, the implant energy may vary from approximately 5-50 keV.

Figure 2D:
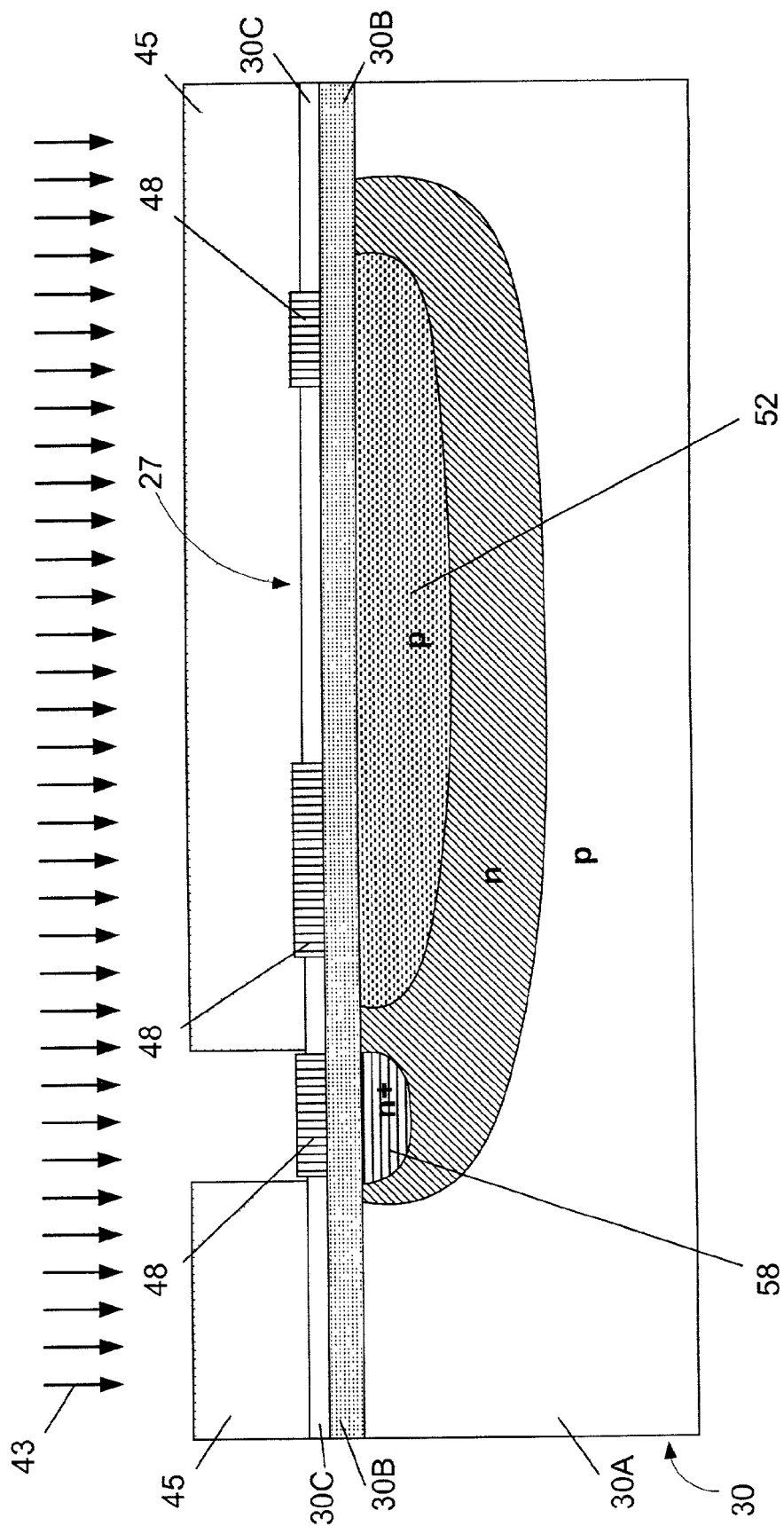

Next, the masking layer 41 depicted in FIG. 2C is removed and another masking layer 45 is formed above the substrate 30 as depicted in FIG. 2D. As shown therein, an ion implant process, as indicated by arrows 43, is performed to form a contact well 58 for the first well 50. In the illustrative example of an NMOS transistor, the contact well 58 may be doped with an N-type dopant material, such as arsenic or phosphorous, and it may be doped at a relatively high concentration level, e.g., approximately 2 $e^{20}$ ions/cm$^3$. This may be accomplished by using an implant dose of approximately 2 $e^{15}$-5 $e^{15}$ ions/cm$^2$. As with the other implant processes, the implant energy will vary depending upon the dopant material implanted during the implant process 43. In the illustrative situation where arsenic is implanted during the implant process 43, the implant energy may vary from approximately 10-20 keV.

Figure 2E:
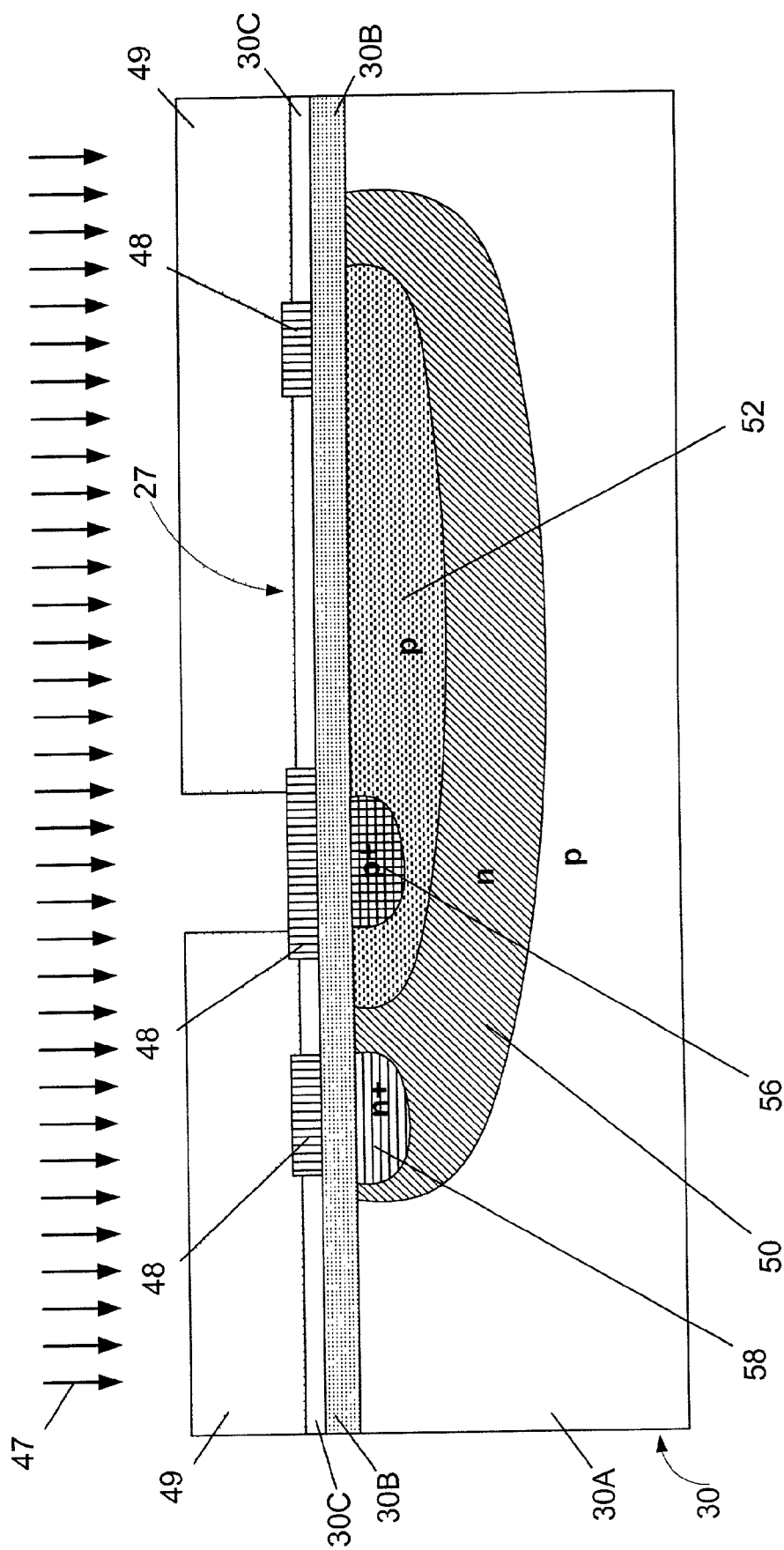

The masking layer 45 may then be removed and another masking layer 49 may be formed as indicated in FIG. 2E. Thereafter, another ion implant process 47 is performed to form contact well 56 in the second well 52. In the case of an illustrative NMOS transistor, the contact well 56 may be comprised of a P-type dopant material, such as boron, boron difluoride, etc. Moreover, the contact well 56 may have a dopant concentration level of approximately 2 $e^{20}$ ions/cm$^3$. This may be accomplished by using an implant dose of approximately 2 $e^{15}$-5 $e^{15}$ ions/cm$^2$. As with the other implant processes, the implant energy will vary depending upon the dopant material implanted during the implant process 43. In the illustrative situation where boron is implanted during the implant process 43, the implant energy may vary from approximately 3-10 keV. As those skilled in the art will recognize after a complete reading of the present application, the contact wells 56, 58 may be formed after the first and second wells have been formed, and they may be formed in either order.

Figure 2F:
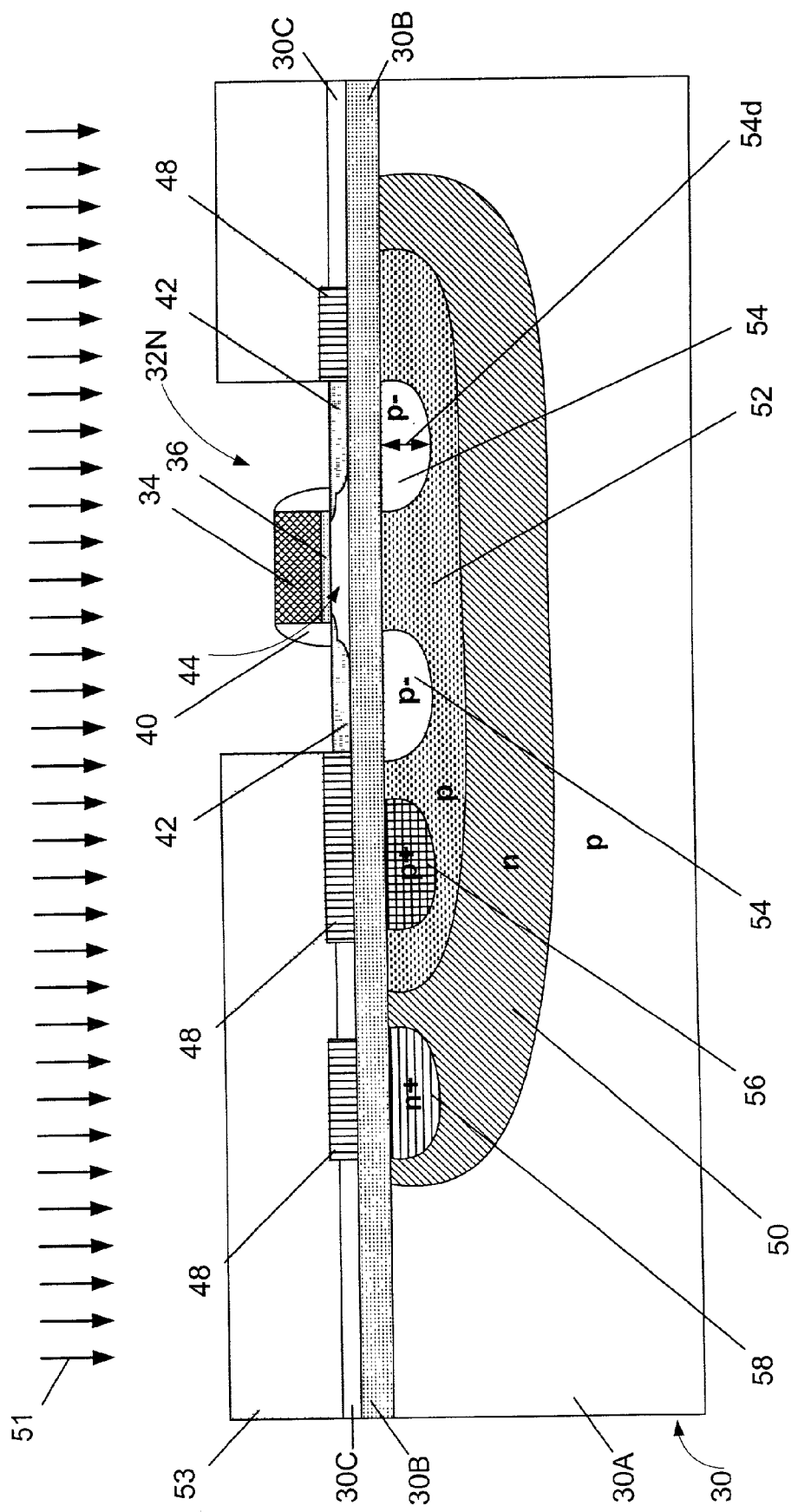

Then, as depicted in FIG. 2F, a transistor 32N is formed in the active layer 30C of the substrate 30. The illustrative transistor 32N depicted in FIG. 2F is comprised of a gate insulation layer 36, a gate electrode 34, sidewall spacers 40 and source/drain regions 42. A variety of known techniques and materials may be used in forming the various components of the illustrative transistor 32 depicted in FIG. 2F. For example, the gate insulation layer 36 may be comprised of silicon dioxide, the gate electrode 34 may be comprised of a doped polysilicon and the sidewall spacers 40 may be comprised of silicon dioxide or silicon nitride. In the case of an illustrative NMOS transistor, the source/drain regions 42 may be doped with an appropriate N-type dopant material, such as arsenic or phosphorous, and they may be formed using traditional extension implants and source/drain implants. Thus, the particular materials and methodologies used in forming the illustrative transistor 32N should not be considered limitations of the present invention unless such limitations are clearly set forth in the appended claims. Moreover, FIG. 2F does not depict all of the components of such a transistor. For example, the source/drain regions 42 may have elevated portions (not shown) formed above the active layer 30C, and/or metal silicide regions 42 formed on the source/drain regions 42 and the gate electrode 34. However, such details are not depicted for purposes of clarity.

Next, as shown in FIG. 2F, an ion implant process, as indicated by arrows 51, is performed through the masking layer 53 to form source/drain wells 54 in the bulk substrate 30A within the second well 52. The source/drain wells 54 have a depth 54d that may vary from approximately 10-90 nm. At the completion of the implant process, the source/drain wells 54 will be comprised of a dopant material that is the same type as the dopant material used for the second well 54, but the concentration level of dopant material in the source/drain wells 54 will be less than the concentration level of dopant material in the second well 52. In the case of an illustrative NMOS transistor, the source/drain wells 54 may be formed by a counter-doping technique. More particularly, in one embodiment, the source/drain wells 54 may be formed by implanting N-type dopant atoms, e.g., arsenic or phosphorous, at a dopant dose ranging from approximately $4 e^{11} - 1 e^{15}$ ions/cm$^2$ into the P-type doped second well 52. The implant energy for the implant process 51 will vary depending upon the particular dopant species implanted. In the illustrative example where phosphorous is the dopant material, the implant energy for the implant process 51 may vary between approximately 15-90 keV. This will result in the source/drain wells 54 having a P-type dopant concentration of approximately $10^{15}$-$10^{17}$ ions/cm$^3$.

The purpose of the source/drain wells 54 is to reduce the dopant concentration in the bulk substrate 30A in the areas underneath the source/drain regions 42 of the transistor 32 to thereby decrease the junction capacitance of the source/drain regions 42. The implant process 51 used to form the source/drain wells 54 may be performed at any time after the gate electrode 34 of the device is formed. However, typically the implant process 51 will be performed after one or more sidewall spacers 40 are formed adjacent the gate electrode 34. Performing the implant process 51 after the sidewall spacers 40 are formed helps to insure that the bulk substrate 30A in the area under the channel region 44 of the transistor 32 remains at a relatively high dopant concentration level, e.g., approximately the same as that of the second well 52. Moreover, performing the implant process 51 after spacer formation also helps to insure that the source/drain wells 54, having lower dopant concentration levels (as compared to the second well 52), are positioned under the source/drain regions 42 of the transistor 32 and somewhat spaced away from the channel region 44. The dopant concentration level of the source/drain wells 54 should be as low as possible, and the doping level of the wells 54 can be greater than, less than, or equal to the dopant concentration level in the bulk substrate 30A.

Thereafter, the masking layer 53 of FIG. 2F is removed and traditional processing techniques may be performed to complete the formation of the transistor 32N. For example, as shown in FIG. 2A, a layer of insulating material 31 may be formed above the active layer 30C and a plurality of source/drain contacts 46 may be formed to provide electrical connection to the source/drain regions 42. An additional contact 60 may be formed to provide electrical connection to the first well 50, and another contact 62 may be formed to provide electrical connection to the second well 52.

As described herein, some of the various doped regions may be doped with the same type of dopant material, i.e., N-type or P-type. For example, for an illustrative NMOS transistor, the second well 52, the bulk substrate 30A and the source/drain wells 54 are all doped with a P-type dopant material. However, the various doped regions need not be doped with the same species of dopant material, although in some cases they may be. For example, in the case of an NMOS device, the bulk substrate 30A and the second well 52 may be doped using boron difluoride, while the source/drain wells 54 may be doped with boron. Thus, the particular species used in forming the various implant regions depicted herein should not be considered as a limitation of the present invention unless such limitations are expressly recited in the appended claims. Moreover, the various implant regions depicted herein may be subject to standard anneal processes after the implantation processes are performed, or a lower temperature anneal process may be performed in an effort to limit movement of the implanted dopant materials.

The construction of a transistor 32N in accordance with the present invention provides many useful benefits. For example, when the transistor 32N is off, a negative voltage on the order of approximately −0.1 −−2.0 volts may be applied to the second well 52 via contact 62, thereby reducing leakage current when the device 32N is off. Alternatively, when the transistor 32N is on, the second well 52 may be positively biased by applying a voltage of approximately 0.1-1.0 volts via contact 62. By applying this positive bias to the well 52, the drive current of the transistor 32N may be increased, thereby tending to increase overall operating speed of the transistor 32N and integrated circuit incorporating such a transistor. This ability to modulate the same transistor to have low leakage current and high drive current is well-suited for incorporation into low-power, high-performance integrated circuit designs.

Figure 3B:
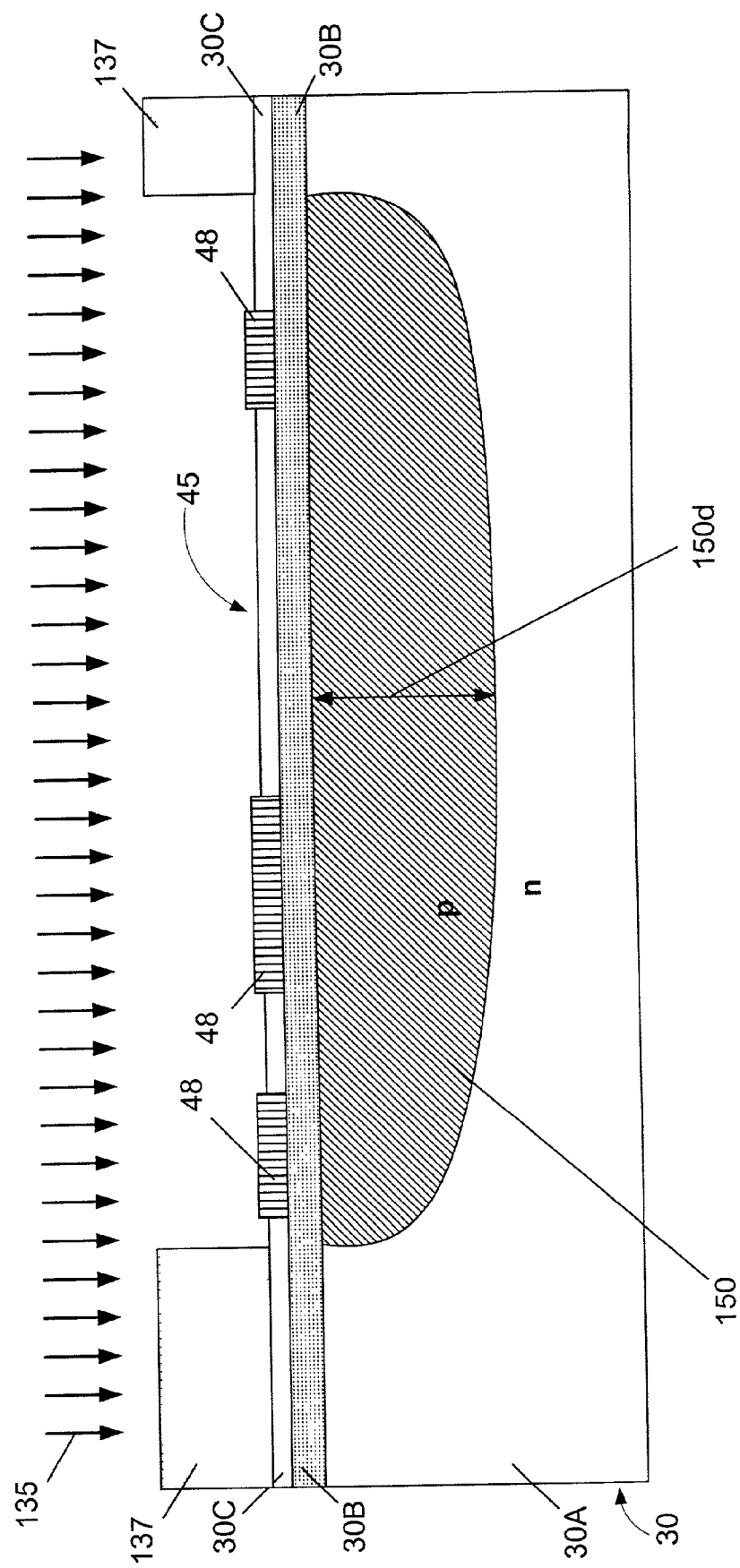

One illustrative method for forming the illustrative PMOS transistor 32P depicted in FIG. 3A will now be described with reference to FIGS. 3B-3F. Initially, as shown in FIG. 3B, a masking layer 137 is formed above the active layer 30C of the substrate 30. Thereafter, an ion implant process 135 may be performed to form the first well 150 in the bulk substrate 30A. The first well 150 may have a depth 150d that varies from approximately 50-150 nm. Again, in the context of the formation of a PMOS device, the ion implant process 135 may be performed using a P-type dopant material, such as boron, boron difluoride, etc., at a dopant dose of approximately $5 e^{10}$-$1.5 e^{14}$ ions/cm$^2$. The resulting first well 150 has a dopant concentration level that ranges from approximately $10^{16}$-$10^{19}$ ions/cm$^3$. The implant energy used during the ion implant process 135 will vary depending upon the species of dopant atoms implanted. In the illustrative embodiment where boron is the dopant material, the implant energy may vary from approximately 10-45 keV.

Figure 3C:
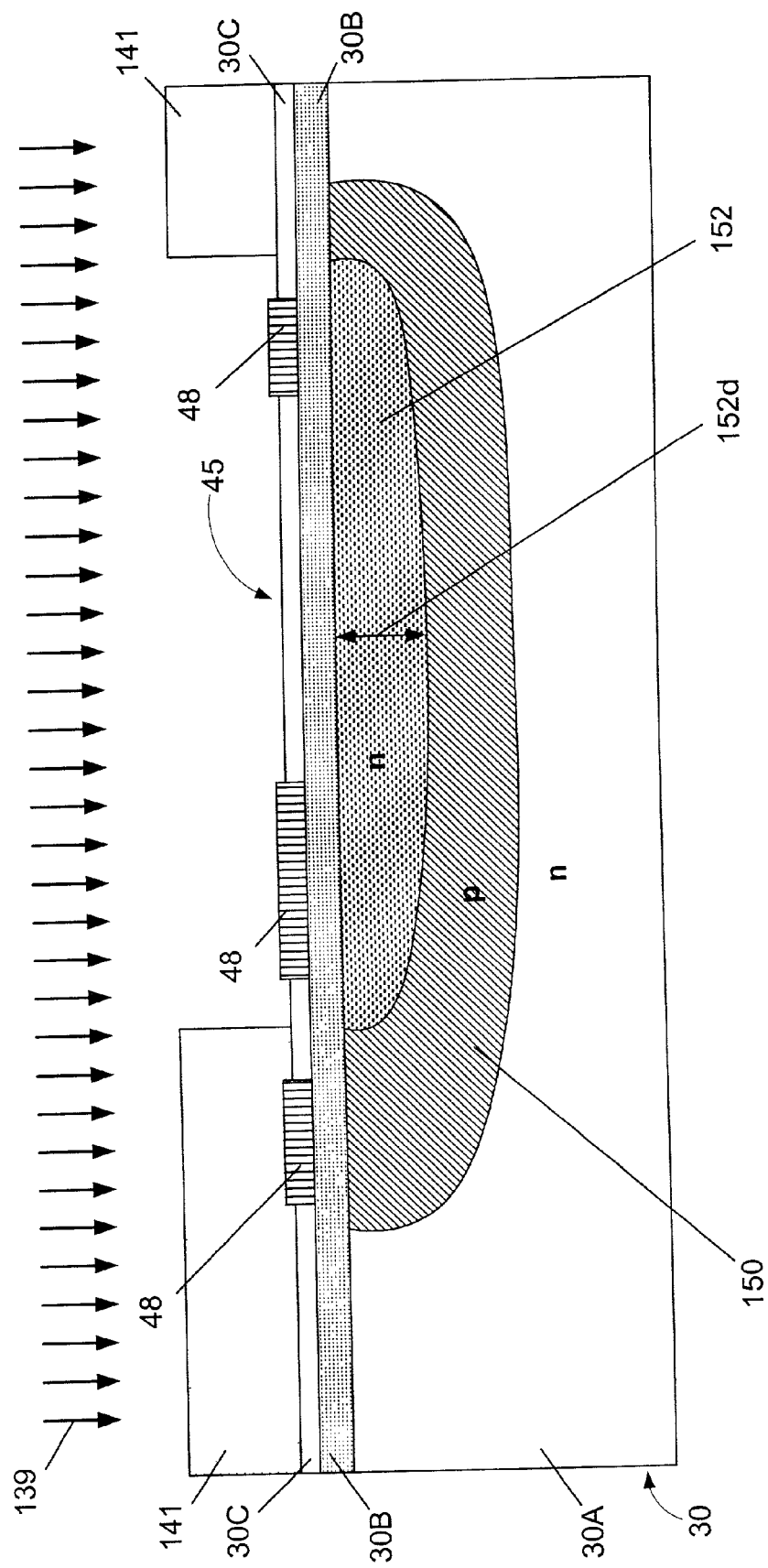

Thereafter, as shown in FIG. 3C, another ion implant process, as indicated by arrows 139, is performed through the masking layer 141 to form the second well 152 in the bulk substrate 30A. The second well 152 is doped with a dopant material that is a type opposite to that of the dopant material used in the first well 150. In the case of an illustrative PMOS transistor, the second well 152 may be doped with an N-type dopant material, such as arsenic, phosphorous, etc. The second well 152 may have a depth 152d that varies from approximately 40-100 nm. In one illustrative embodiment, the second well 152 has a dopant concentration of approximately $10^{17}$-$10^{20}$ ions/cm$^3$. In the context of the formation of a PMOS device, the ion implant process 139 may be performed with an N-type dopant material, e.g., arsenic, phosphorous, etc., at a dopant dose of approximately $4 e^{11}$-$1 e^{15}$ ions/cm$^2$. The implant energy used during the implant process 139 will vary depending upon the species of the dopant atoms implanted. In the illustrative embodiment where arsenic is the dopant material, the implant energy may vary from approximately 10-35 keV.

Figure 3D:
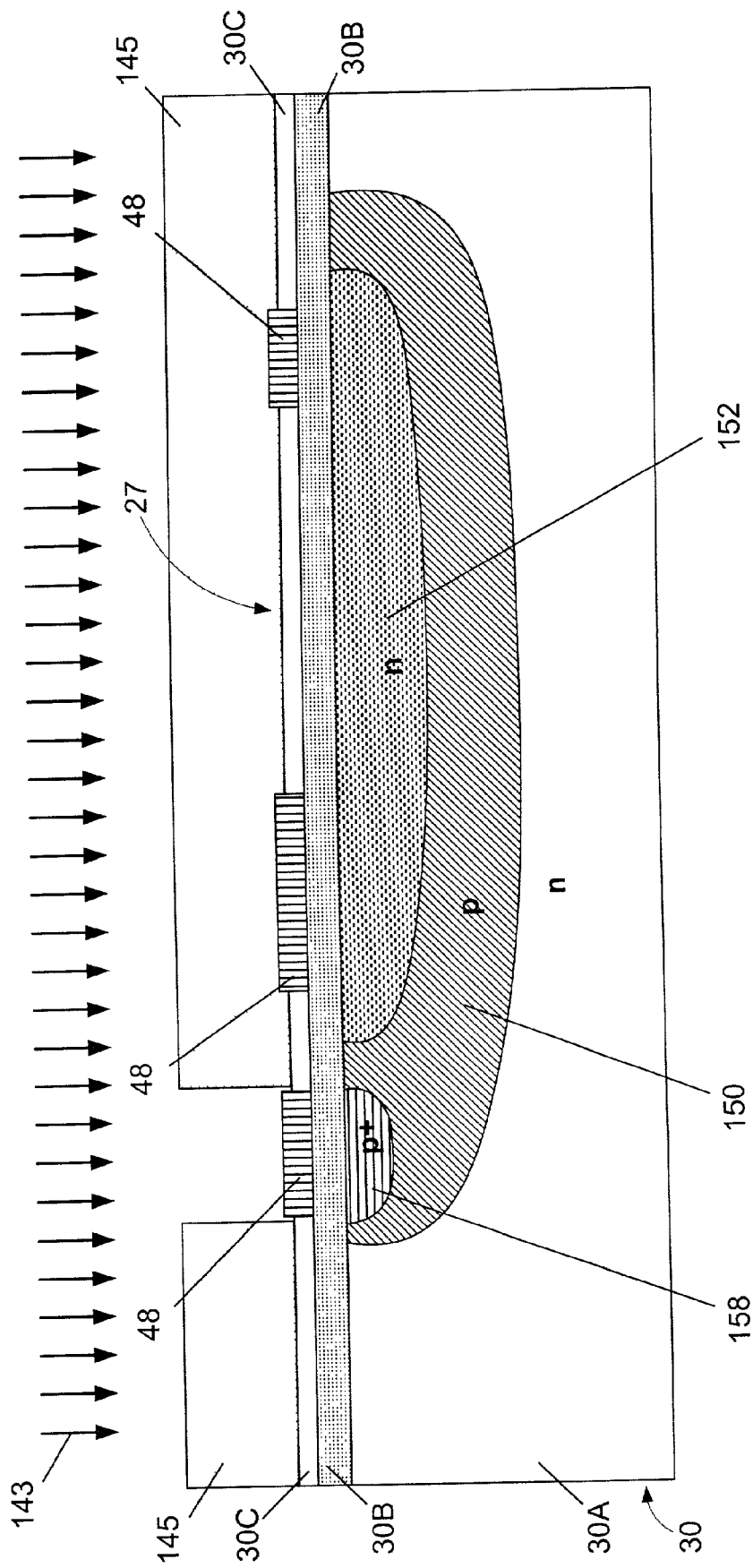

Next, as depicted in FIG. 3D, another ion implant process, as indicated by arrows 143, is performed through the masking layer 145 to form a contact well 158 for the first well 150. In the illustrative example of a PMOS transistor, the contact well 158 may be doped with a P-type dopant material, such as boron or boron difluoride, and it may be doped at a relatively high concentration level, e.g., approximately $2 \, e^{20}$ ions/cm$^3$. This may be accomplished by using an implant dose of approximately $2 \, e^{15}$-$5 \, e^{15}$ ions/cm$^2$. As with the other implant processes, the implant energy will vary depending upon the dopant material implanted during the implant process 143. In the illustrative situation where boron is implanted during the implant process 143, the implant energy may vary from approximately 3-10 keV.

Figure 3E:
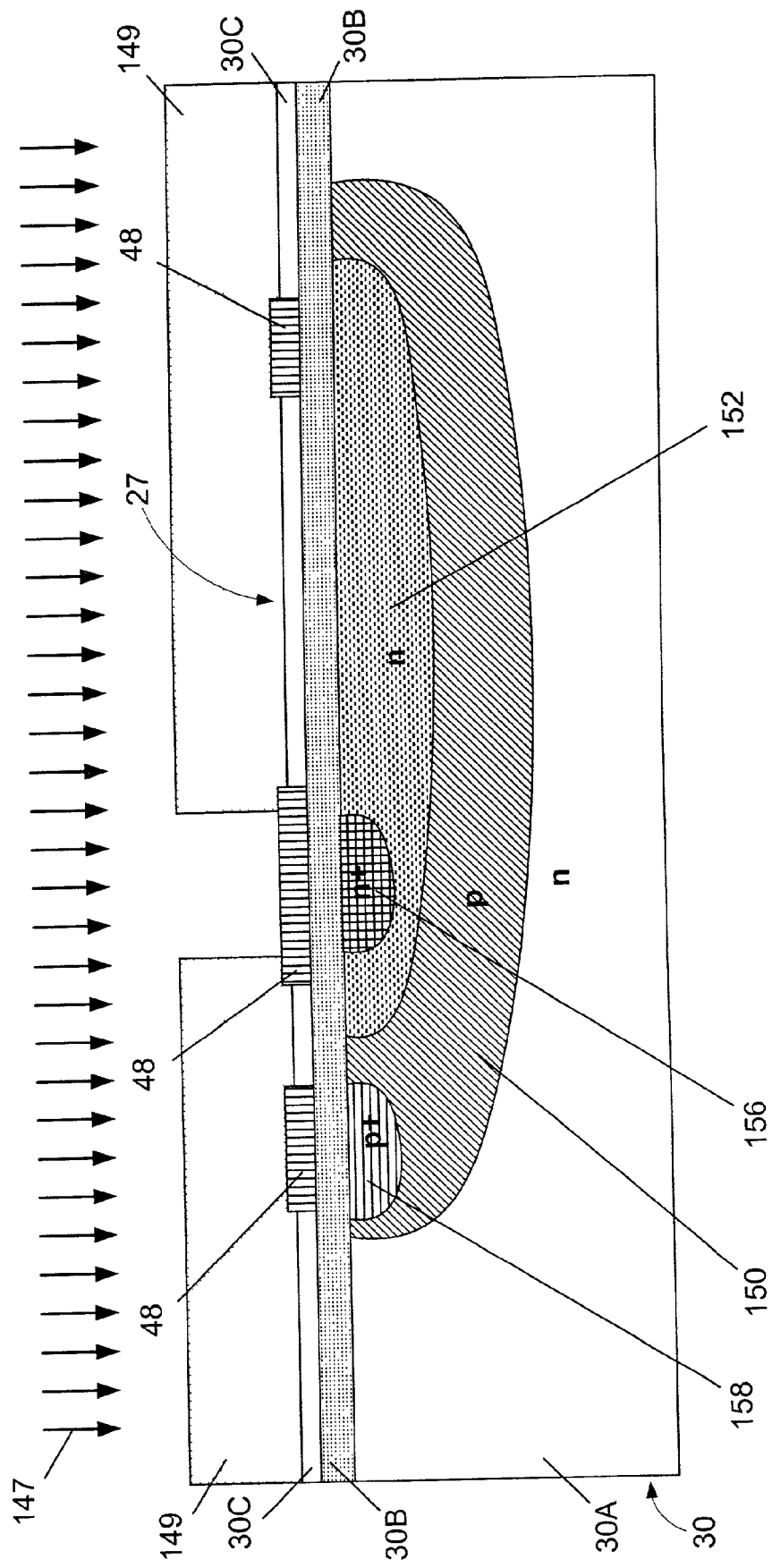

Thereafter, as shown in FIG. 3E, another ion implant process 147 is performed through a masking layer 149 to form contact well 156 in the second well 152. In the case of an illustrative PMOS transistor, the contact well 156 may be comprised of an N-type dopant material, such as arsenic, phosphorous, etc. Moreover, the contact well 156 may have a dopant concentration level of approximately $2 \, e^{20}$ ions/cm$^3$. This may be accomplished by using an implant dose of approximately $2 \, e^{5}$-$5 \, e^{15}$ ions/cm$^2$. As with the other implant processes, the implant energy will vary depending upon the dopant material implanted during the implant process 143. In the illustrative situation where arsenic is implanted during the implant process 143, the implant energy may vary from approximately 10-20 keV. As those skilled in the art will recognize after a complete reading of the present application, the contact wells 156, 158 may be formed in either order.

Figure 3F:
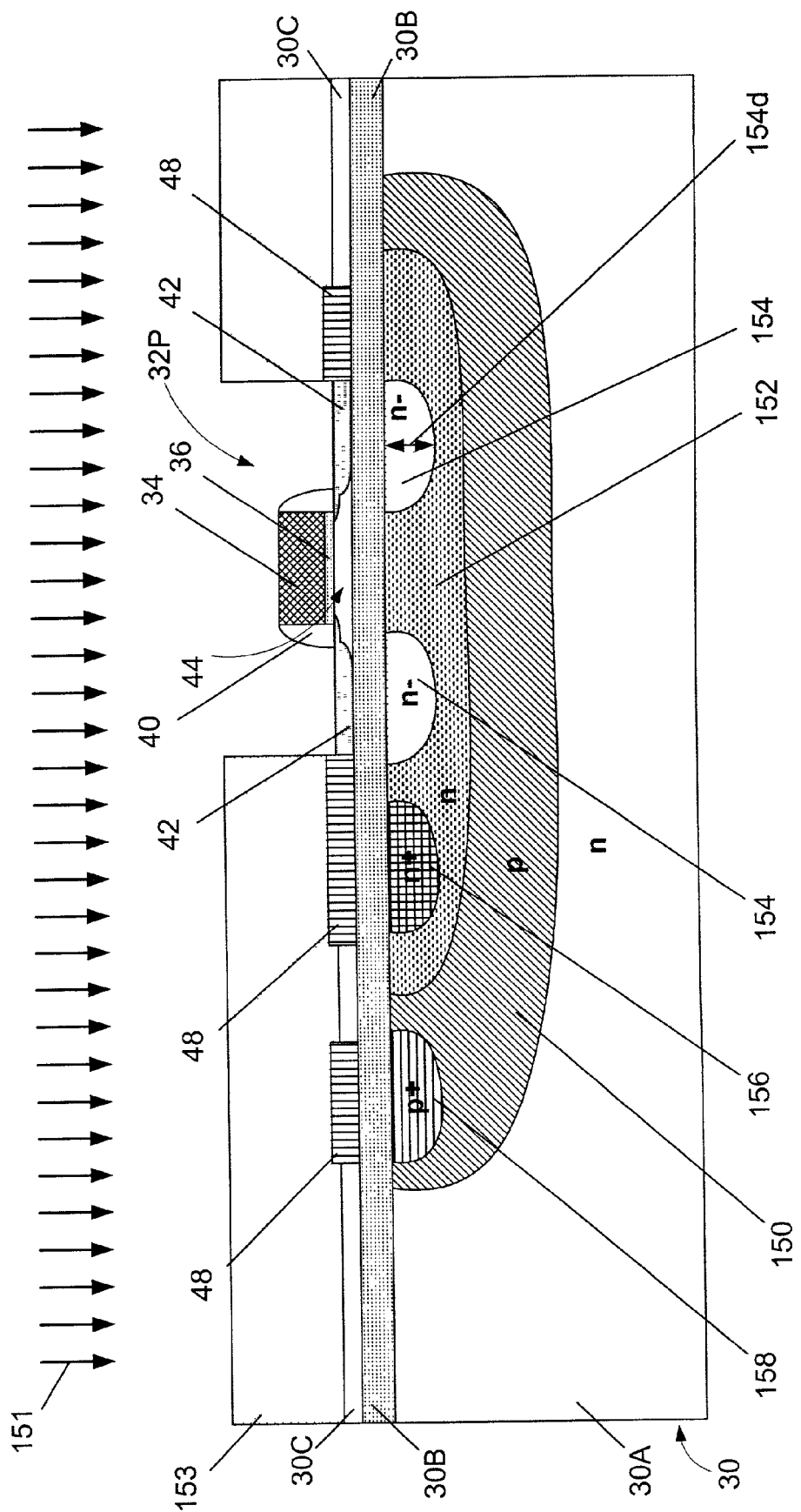

Then, as depicted in FIG. 3F, a transistor 32P is formed in the active layer 30C of the substrate 30 using traditional manufacturing techniques and materials. In the case of an illustrative PMOS transistor, the source/drain regions 42 may be doped with an appropriate P-type dopant material, such as boron or boron difluoride, and they may be formed using traditional extension implants and source/drain implants.

Next, as shown in FIG. 3F, an ion implant process, as indicated by arrows 151, is performed through the masking layer 153 to form source/drain wells 154 in the bulk substrate 30A within the second well 152. The source/drain wells 154 have a depth 154d that may vary from approximately 10-90 nm. At the completion of the implant process, the source/drain wells 154 will be comprised of a dopant material that is the same type as the dopant material used for the second well 154, but the concentration level of dopant material in the source/drain wells 154 will be less than the concentration level of dopant material in the second well 152. In the case of an illustrative PMOS transistor, the source/drain wells 154 may be formed by a counter-doping technique. More particularly, in one embodiment, the source/drain wells 154 may be formed by implanting P-type dopant atoms, e.g., boron or boron difluoride, at a dopant dose ranging from approximately $4 \, e^{11}$-$1 \, e^{15}$ ions/cm$^2$ into the N-doped second well 152. The implant energy for the implant process 151 will vary depending upon the particular dopant species implanted. In the illustrative example where boron is the dopant material, the implant energy for the implant process 151 may vary between approximately 10-25 keV. This will result in the source/drain wells 154 having an N-type dopant concentration level of approximately $10^{15}$-$10^{17}$ ions/cm$^3$. Similar to the NMOS device, the implant process 151 used to form the source/drain wells 154 may be performed at any time after the gate electrode 34 of the device is formed. However, typically the implant process 151 will be performed after one or more sidewall spacers 40 are formed adjacent the gate electrode 34. Thereafter, the masking layer 153 of FIG. 3F is removed and traditional processing techniques may be performed to complete the formation of the transistor 32P.

In this embodiment, when the PMOS transistor 32P is off, a positive voltage on the order of approximately 0.1-2.0 volts may be applied to the second well 152 via contact 162, thereby reducing leakage current when the device 32P is off. Alternatively, when the PMOS transistor 32P is on, the second well 152 may be negatively biased by applying a voltage of approximately -0.1--1.0 volts via contact 162. By applying this negative bias to the well 152, the drive current of the PMOS transistor 32P may be increased, thereby tending to increase overall operating speed of the PMOS transistor 32P and integrated circuit incorporating such a transistor.

The make the transistors depicted in FIGS. 4 and 5, the processes used to form the outer wells 50, 150 may be omitted. In the case of a CMOS application, wherein the transistor 32N of FIG. 2A is formed adjacent the transistor 32P depicted in FIG. 5, various masking layers may be formed to shield, for example, the area to be occupied by the PMOS transistor 32P during the ion implant processes used to form the wells 50 and 52 of the NMOS transistor 32N. Thereafter, one or more masking layers may be formed above the wells 50, 52, and the implant process used to form the inner well 152 for the PMOS transistor 32P depicted in FIG. 5 may be performed. This process flow is provided by way of example only, as other methods of masking the SOI substrate 30 to achieve the desired doped wells within the bulk substrate 30A may be performed by those skilled in the art.

The present invention is generally directed to transistors with controllable threshold voltages, and various methods of making and operating same. In one illustrative embodiment, the method comprises providing an SOI substrate comprised of an active layer, a buried insulation layer and a bulk substrate, the active layer being doped with a first type of dopant material, the bulk substrate having an inner well formed therein adjacent a surface of the bulk substrate and under the active layer, the inner well being doped with the first type of dopant material, forming a transistor above the SOI substrate in an area above the inner well and applying a voltage to the inner well to vary a threshold voltage of the transistor. In some embodiments, the method further comprises forming an NMOS transistor, wherein the active layer and the inner well are doped with a P-type dopant material. In other embodiments, the method further comprises forming a PMOS transistor, wherein the active layer and the inner well are doped with an N-type dopant material. In even further embodiments, the method further comprises applying a voltage to the inner well that falls within a range, inclusively, from positive drain voltage ($+V_{dd}$) to negative drain voltage ($-V_{dd}$).

In another illustrative embodiment, the method comprises providing a consumer product comprised of at least one integrated circuit product, the integrated circuit product being comprised of at least one transistor formed in an active layer of an SOI substrate, the SOI substrate further comprising an inner well formed adjacent a surface of a bulk substrate of the SOI substrate, the inner well being formed under the active layer, the active layer and the inner well being doped with a first type of dopant material, sensing an activity level of the integrated circuit product and applying a voltage of a magnitude and a polarity to the inner well of at least one transistor, the magnitude and polarity of the applied voltage being determined based upon the sensed activity level of the integrated circuit product. In some embodiments, the consumer product comprises at least one of a personal computer, a portable computer, a mobile telephone, a digital camera, a personal digital assistant and a wireless internet appliance, and the integrated circuit product is at least one of a microprocessor, a digital signal process, an application-specific integrated circuit product, a memory array and a logic device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    providing an SOI substrate comprised of an active layer, a buried insulation layer and a bulk substrate, said active layer being doped with a first type of dopant material, said bulk substrate having an inner well and an outer well, each of which are formed within said bulk substrate and under said buried insulation layer and said active layer, said inner well being positioned within said outer well, said inner well being doped with said first type of dopant material and defining an area, said outer well being doped with a dopant material that is of a type opposite said first type of dopant material;
    forming a transistor above said SOI substrate entirely within said area defined by said inner well;
    forming a plurality of physically separated source/drain wells in said bulk substrate under said buried insulation layer and within said inner well, said source/drain wells being doped with said first type of dopant material and
    applying a voltage to said inner well to vary a threshold voltage of said transistor.

2. The method of claim 1, wherein said active layer and said inner well are doped with the same dopant species.

3. The method of claim 1, wherein said active layer and said inner well are doped with different dopant species.

4. The method of claim 1, wherein applying a voltage to said inner well comprises applying a voltage to said inner well that falls within a range, inclusively, from positive drain voltage $(+V_{dd})$ to negative drain voltage $(-V_{dd})$.

5. A method, comprising:
    providing an SOI substrate comprised of an active layer, a buried insulation layer and a bulk substrate doped with a P-type dopant material, a first region of said active layer being doped with a P-type dopant material, a second region of said active layer being doped with an N-type dopant material, said bulk substrate having a first inner well, a second inner well and an outer well, each of which are formed within the bulk substrate under said buried insulation layer, said first inner well being positioned under said first region of said active layer, said first inner well being doped with a P-type dopant material and defining a first area, said outer well being doped with an N-type dopant material, said first inner well being positioned within said outer well, said second inner well being positioned under said second region of said active layer, said second inner well being doped with an N-type dopant material and defining a second area;
    forming an NMOS transistor in said first region of said active layer above and entirely within said first area defined by said first inner well;
    forming a PMOS transistor in said second region of said active layer above and entirely within said second area defined by said second inner well;
    forming a plurality of physically separated source/drain wells in said bulk substrate under said buried insulation layer and within said inner well, said source/drain wells being doped with said first type of dopant material and
    applying at least one voltage to at least one of said first inner well and said second inner well to vary a threshold voltage of said NMOS transistor and said PMOS transistor, respectively.

6. The method of claim 5, wherein said first region of said active layer and said first inner well are doped with the same dopant species.

7. The method of claim 5, wherein said first region of said active layer and said first inner well are doped with different dopant species.

8. The method of claim 5, wherein said second region of said active layer and said second inner well are doped with the same dopant species.

9. The method of claim 5, wherein said second region of said active layer and said second inner well are doped with different dopant species.

10. The method of claim 5, wherein applying at least one voltage to at least one of said first inner well and said second inner well to vary a threshold voltage of said NMOS transistor and said PMOS transistor, respectively, comprises applying a positive voltage to said first inner well to reduce said threshold voltage of said NMOS transistor.

11. The method of claim 5, wherein applying at least one voltage to at least one of said first inner well and said second inner well to vary a threshold voltage of said NMOS transistor and said PMOS transistor, respectively, comprises applying a negative voltage to said first inner well to increase said threshold voltage of said NMOS transistor.

12. The method of claim 5, wherein applying at least one voltage to at least one of said first inner well and said second inner well to vary a threshold voltage of said NMOS transistor and said PMOS transistor, respectively, comprises applying a negative voltage to said second inner well to reduce said threshold voltage of said PMOS transistor.

13. The method of claim 5, wherein applying at least one voltage to at least one of said first inner well and said second inner well to vary a threshold voltage of said NMOS transistor and said PMOS transistor, respectively, comprises applying a positive voltage to said second inner well to increase said threshold voltage of said PMOS transistor.

14. The method of claim 5, wherein applying at least one voltage to at least one of said first inner well and said second inner well to vary a threshold voltage of said NMOS transistor and said PMOS transistor, respectively, comprises applying a voltage to said first inner well that ranges, inclusively, from positive drain voltage $(+V_{dd})$ to negative drain voltage $(-V_{dd})$.

15. The method of claim 5, wherein applying at least one voltage to at least one of said first inner well and said second inner well to vary a threshold voltage of said NMOS transistor and said PMOS transistor, respectively, comprises applying a voltage to said second inner well that ranges, inclusively, from positive drain voltage $(+V_{dd})$ to negative drain voltage $(-V_{dd})$.

16. A method, comprising:
    providing an SOI substrate comprised of an active layer, a buried insulation layer and a bulk substrate doped with a P-type dopant material, a first region of said active layer being doped with a P-type dopant material, a second region of said active layer being doped with an N-type dopant material, said bulk substrate having a first inner well, a second inner well and an outer well, each of which are formed within the bulk substrate under said buried insulation layer, said first inner well being positioned under said first region of said active layer, said first inner well being doped with a P-type dopant material and defining a first area, said bulk substrate further comprising an outer well being doped with an N-type dopant material, said first inner well being positioned within said outer well, said second inner well being positioned under said second region of said active layer, said second inner well being doped with an N-type dopant material and defining a second area;

forming an NMOS transistor in said first region of said active layer above and entirely within said first area defined by said first inner well;

forming a PMOS transistor in said second region of said active layer above and entirely within said second area defined by said second inner well;

applying a first voltage to said first inner well to vary a threshold voltage of said NMOS transistor;

forming a plurality of physically separated source/drain wells in said bulk substrate under said buried insulation layer and within said inner well, said source/drain wells being doped with said first type of dopant material and applying a second voltage to said second inner well to vary a threshold voltage of said PMOS transistor.

17. The method of claim 16, wherein said first region of said active layer and said first inner well are doped with the same dopant species.

18. The method of claim 16, wherein said first region of said active layer and said first inner well are doped with different dopant species.

19. The method of claim 16, wherein said second region of said active layer and said second inner well are doped with the same dopant species.

20. The method of claim 16, wherein said second region of said active layer and said second inner well are doped with different dopant species.

21. The method of claim 16, wherein applying a first voltage to said first inner well to vary a threshold voltage of said NMOS transistor comprises applying a positive voltage to said first inner well to reduce said threshold voltage of said NMOS transistor.

22. The method of claim 16, wherein applying a first voltage to said first inner well to vary a threshold voltage of said NMOS transistor comprises applying a negative voltage to said first inner well to increase said threshold voltage of said NMOS transistor.

23. The method of claim 16, wherein applying a second voltage to said second inner well to vary a threshold voltage of said PMOS transistor comprises applying a negative voltage to said second inner well to reduce said threshold voltage of said PMOS transistor.

24. The method of claim 16, wherein applying a second voltage to said second inner well to vary a threshold voltage of said PMOS transistor comprises applying a positive voltage to said second inner well to increase said threshold voltage of said PMOS transistor.

25. The method of claim 16, wherein applying a first voltage to said first inner well comprises applying a first voltage to said first inner well that falls within a range, inclusively, from positive drain voltage ($+V_{dd}$) to negative drain voltage ($-V_{dd}$).

26. The method of claim 16, wherein applying a second voltage to said second inner well comprises applying a second voltage to said second inner well that falls within a range, inclusively, from positive drain voltage ($+V_{dd}$) to negative drain voltage ($-V_{dd}$).

27. The method of claim 16, wherein said first and second voltages have opposite polarities.

28. The method of claim 16, wherein said first and second voltages have the same polarity.

29. The method of claim 1, wherein forming said plurality of physically separated source/drain wells comprises forming said plurality of physically separated source/drain wells such that said source/drain wells have a dopant concentration of said first type of dopant that is less than said dopant concentration of said first type of dopant in said inner well.

30. The method of claim 5, wherein forming said plurality of physically separated source/drain wells comprises forming said plurality of physically separated source/drain wells such that said source/drain wells have a dopant concentration of said first type of dopant that is less than said dopant concentration of said first type of dopant in said inner well.

31. The method of claim 16, wherein forming said plurality of physically separated source/drain wells comprises forming said plurality of physically separated source/drain wells such that said source/drain wells have a dopant concentration of said first type of dopant that is less than said dopant concentration of said first type of dopant in said inner well.

* * * * *